(12) United States Patent
Mizokuchi et al.

(10) Patent No.: US 9,324,837 B2
(45) Date of Patent: Apr. 26, 2016

(54) SEMICONDUCTOR DEVICE WITH VERTICAL GATE AND METHOD OF MANUFACTURING THE SAME

(71) Applicant: Panasonic Corporation, Osaka (JP)

(72) Inventors: Shuji Mizokuchi, Niigata (JP); Ryousuke Ookawa, Nara (JP); Naoki Sato, Niigata (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/497,615

(22) Filed: Sep. 26, 2014

(65) Prior Publication Data

US 2015/0011066 A1 Jan. 8, 2015

Related U.S. Application Data

(60) Division of application No. 13/653,512, filed on Oct. 17, 2012, now abandoned, which is a continuation-in-part of application No. PCT/JP2012/002382, filed on Apr. 5, 2012.

(30) Foreign Application Priority Data

Apr. 20, 2011 (JP) .................................. 2011-094415

(51) Int. Cl.
*H01L 21/336* (2006.01)
*H01L 29/66* (2006.01)
(Continued)

(52) U.S. Cl.
CPC ........ *H01L 29/66666* (2013.01); *H01L 21/266* (2013.01); *H01L 21/2652* (2013.01); *H01L 21/28035* (2013.01); *H01L 21/3212* (2013.01); *H01L 21/32133* (2013.01);
(Continued)

(58) Field of Classification Search
CPC ............ H01L 29/0865; H01L 29/0869; H01L 29/1095; H01L 29/41766; H01L 29/4236; H01L 21/2652; H01L 21/28035; H01L 21/3212; H01L 21/32133; H01L 21/266
USPC ......................................................... 257/330
See application file for complete search history.

(56) References Cited

U.S. PATENT DOCUMENTS

| | | | |
|---|---|---|---|
| 6,051,488 A | 4/2000 | Lee et al. | 438/589 |
| 6,569,764 B1 | 5/2003 | Hirashima et al. | 438/673 |

(Continued)

FOREIGN PATENT DOCUMENTS

| | | |
|---|---|---|
| JP | 2001-189456 | 7/2001 |
| JP | 2004-119616 | 4/2004 |

(Continued)

OTHER PUBLICATIONS

Japanese version of International search report of PCT application No. PCT/JP2012/002382 dated May 15, 2012.

*Primary Examiner* — Phat X Cao
*Assistant Examiner* — Mohammad M Hoque
(74) *Attorney, Agent, or Firm* — Panasonic Patent Center

(57) ABSTRACT

A gate electrode is formed in a trench reaching a drain region so as to leave a concave portion on the top of the trench. A first insulating film is formed, which fills the concave portion and of which the thickness increases as the distance from an end of the trench increases on the substrate surface on both sides of the trench. First and second source regions are formed in a self-alignment manner by introduction of impurities through the first insulating film.

20 Claims, 31 Drawing Sheets

(51) Int. Cl.
  *H01L 21/265* (2006.01)
  *H01L 29/08* (2006.01)
  *H01L 29/10* (2006.01)
  *H01L 29/78* (2006.01)
  *H01L 21/266* (2006.01)
  *H01L 21/28* (2006.01)
  *H01L 21/321* (2006.01)
  *H01L 21/3213* (2006.01)
  *H01L 29/423* (2006.01)

(52) U.S. Cl.
  CPC ....... *H01L 29/0865* (2013.01); *H01L 29/0869* (2013.01); *H01L 29/1095* (2013.01); *H01L 29/4236* (2013.01); *H01L 29/66734* (2013.01); *H01L 29/7813* (2013.01); *H01L 29/086* (2013.01)

(56) References Cited

U.S. PATENT DOCUMENTS

| | | | |
|---|---|---|---|
| 6,624,469 B1 | 9/2003 | Harada | |
| 6,916,745 B2 | 7/2005 | Herrick et al. | |
| 7,344,943 B2 | 3/2008 | Herrick et al. | |
| 7,400,014 B2 | 7/2008 | Thapar | 257/330 |
| 7,573,096 B2 | 8/2009 | Takemori et al. | 257/330 |
| 7,595,524 B2 | 9/2009 | Herrick et al. | |
| 7,799,636 B2 | 9/2010 | Herrick et al. | |
| 7,851,312 B2 | 12/2010 | Grivna | 438/279 |
| 8,378,392 B2 | 2/2013 | Hsieh | 257/270 |
| 8,502,305 B2 | 8/2013 | Ohta et al. | 257/330 |
| 8,642,459 B2 | 2/2014 | Poelzl | 438/595 |
| 2004/0183136 A1 | 9/2004 | Williams et al. | 257/369 |
| 2005/0035398 A1 | 2/2005 | Williams et al. | 257/329 |
| 2005/0161734 A1 | 7/2005 | Miyata et al. | |
| 2005/0167748 A1 | 8/2005 | Onda et al. | |
| 2006/0060916 A1 | 3/2006 | Girdhar et al. | 257/330 |
| 2006/0141739 A1 | 6/2006 | Poelzl | |
| 2007/0290268 A1* | 12/2007 | Numazawa | H01L 21/28185 257/365 |
| 2009/0146177 A1 | 6/2009 | Ng et al. | 257/139 |
| 2009/0236660 A1 | 9/2009 | Takahashi | 257/334 |
| 2010/0006861 A1 | 1/2010 | Yamamoto et al. | 257/77 |
| 2010/0127322 A1 | 5/2010 | Mizokuchi et al. | 257/330 |
| 2011/0169103 A1 | 7/2011 | Darwish et al. | 257/409 |
| 2012/0146090 A1 | 6/2012 | Lui et al. | 257/139 |

FOREIGN PATENT DOCUMENTS

| | | |
|---|---|---|
| JP | 2005-026391 | 1/2005 |
| JP | 2005-209807 | 8/2005 |
| JP | 2005-217202 | 8/2005 |
| JP | 2005-244168 | 9/2005 |
| JP | 2006-073971 | 3/2006 |
| JP | 2006-120894 | 5/2006 |
| JP | 2006-332231 | 12/2006 |
| JP | 2007-500454 | 1/2007 |
| JP | 4545679 B | 7/2010 |
| JP | 2012-124425 | 6/2012 |
| WO | 2008/069145 | 6/2008 |

* cited by examiner

SEMICONDUCTOR DEVICE WITH VERTICAL GATE AND METHOD OF MANUFACTURING THE SAME

This application is a U.S. national phase application of PCT international application PCT/JP2012/002382 filed on Apr. 5, 2012, which claims priority to Japanese Patent Application No. 2011-094415 filed on Apr. 20, 2011. The disclosures of these applications including the specifications, the drawings, and the claims are hereby incorporated by reference in its entirety.

BACKGROUND

1. Technical Field

The present invention relates to a semiconductor device with vertical gate having a vertical gate electrode and a method of manufacturing the semiconductor device with vertical gate.

2. Description of the Related Art

With recent requirements for a decrease in power consumption, an improvement in functional performance, and an increase in operation speed in electronic apparatuses, a decrease in power consumption and an increase in operation speed have been also required in semiconductor devices built therein. In order to cope with these requirements, it is necessary to reduce on-resistance of semiconductor devices such as power MOS (Metal Oxide Semiconductor) transistors used in a DC-DC converter or the like of the electronic apparatuses.

Such a type of power semiconductor device employs a vertical-gate structure in which a gate electrode of a semiconductor device is arranged in a direction (hereinafter, referred to as a vertical direction) perpendicular to a principal surface of a semiconductor substrate. For example, in a vertical-gate MOS transistor, a source region on the top of the gate electrode arranged in the vertical direction, a body region in an intermediate portion of the gate electrode, and a drain region on the bottom of the gate electrode are arranged to face each other. In order to further reduce the on-resistance of such a semiconductor device with vertical gate, it is necessary to raise the density of unit cells per unit area.

In the vertical-gate MOS transistor, a source region and a body contact region are formed in the surface of a semiconductor substrate adjacent to the gate electrode. A source electrode electrically connected to the source region and the body contact region is formed on the surface of the semiconductor substrate. An insulating film electrically isolating the gate electrode and the source electrode is formed on the top surface of the gate electrode. In this structure, when the insulating film on the gate electrode protrudes from the surface of the semiconductor substrate and when the vertical gate electrodes are arranged with a small pitch to raise the density of unit cells per unit area, the insulating films get close to each other to form concave portions. These concave portions cause a problem in that voids are formed in the source electrodes embedded in the concave portions, or the like.

As a countermeasure, for example, Unexamined Japanese Patent Publication No. 2005-209807 proposes a technique of forming the top surface of an insulating film on a vertical gate electrode and the surface of a silicon substrate in which a source region exists to form the same plane (including substantially the same plane) in a semiconductor device with vertical gate having plural vertical gate electrodes arranged in parallel. In this technique, the top surface of the vertical gate electrode retreats downward from the surface of the silicon substrate and the source region is then formed on the surface of the silicon substrate. The insulating film is formed on the vertical gate electrode and then a body contact region is formed using a mask patterning (lithography technique). Other examples of such a technique are disclosed in Unexamined Japanese Patent Publication No. 2007-500454 and Japanese Patent No. 4,545,679.

SUMMARY

However, in the semiconductor device with vertical gate disclosed in Unexamined Japanese Patent Publication No. 2005-209807, Unexamined Japanese Patent Publication No. 2007-500454 and Japanese Patent No. 4,545,679, when the gap between the neighboring gate electrodes needs to be further reduced with requirements for a decrease in size, it is necessary to secure a margin of mask superposition shift for used masks and thus the decrease in gate electrode pitch is limited.

The present invention provides a semiconductor device with vertical gate which can stably form a source region even for a small gate electrode pitch without considering mask superposition shift and a method of manufacturing the semiconductor device with vertical gate.

The present invention employs the following technical means. That is, according to an aspect of the present invention, there is provided a method of manufacturing a semiconductor device with vertical gate, including the steps of: (a) forming a drain region of a first conductivity type on a semiconductor substrate; (b) forming a first body region of a second conductivity type, which is opposite to the first conductivity type, on the drain region; (c) forming a trench penetrating the first body region and reaching the drain region; (d) forming a gate electrode in the trench so as to leave a concave portion on the top of the trench after the step of (c); (e) forming a first insulating film that is formed in the concave portion and that has a portion in which a thickness increases with an increase in distance from an end of the trench in the first body region on both sides of the trench after the step of (d); and (f) forming a first source region of the first conductivity type, which is disposed along the trench and which is adjacent to the trench and the top of the gate electrode, by introduction of impurities through the first insulating film after the step of (e).

By employing the method of manufacturing a semiconductor device with vertical gate according to this aspect, it is possible to form the source region without using a lithography technique. Accordingly, it is not necessary to secure a margin of mask superposition shift and it is possible to further reduce the gate electrode pitch, compared with the conventional technique. As a result, it is possible to implement a semiconductor device with vertical gate with smaller on-resistance. The first source region may be formed in a self-alignment manner by introduction of impurities through the etched-back first insulating film, instead of the introduction of impurities through the non-etched-back first insulating film.

According to another aspect of the present invention, the present invention provides a semiconductor device with vertical gate. That is, there is provided a semiconductor device with vertical gate including: a drain region of a first conductivity type that is disposed in a semiconductor substrate; a first body region of a second conductivity type that is disposed on the drain region and that has a conductivity type opposite to the first conductivity type; a trench that penetrates the first body region and that reaches the drain region; a gate electrode that is formed in the trench in a state where a top surface of the gate electrode is located at a position lower than the top end of the trench; a source region of the first conductivity type that is formed on the surface of the first body region along the trench so as to be adjacent to the trench; a first insulating film that is formed in the trench on the gate electrode; a second insulating film that is formed on the first insulating film; and a conductive film that electrically connects the source region and the body region to each other, wherein the first insulating film has a concave portion and the second insulating film is disposed to fill the concave portion.

An embedded insulating film including the first insulating film and the second insulating film may include, for example, the same type of impurities as in the second source region at least in the bottom portion and includes the same type of impurities as in the second body region at least in the top portion.

By employing the semiconductor device with vertical gate according to this aspect, it is possible to form the source region without using a lithography technique. Accordingly, it is not necessary to secure a margin of mask superposition shift and it is possible to further reduce the gate electrode pitch, compared with the conventional technique. As a result, it is possible to implement a semiconductor device with vertical gate with smaller on-resistance. In the semiconductor device with vertical gate, the interface between the source region and the first body region may be formed in a planar shape inclined with respect to the side wall of the trench.

According to the aspects of the present invention, since the first and second source regions as the source region can be formed in a self-alignment manner without using a lithography technique, it is possible to further reduce the gate electrode pitch, compared with the conventional technique. As a result, it is possible to implement a semiconductor device with vertical gate with smaller on-resistance at a low cost.

DETAILED DESCRIPTION OF THE PREFERRED EMBODIMENT

Hereinafter, a semiconductor device according to an exemplary embodiment of the present invention along with a method of manufacturing the semiconductor device will be described with reference to the accompanying drawings. In the following exemplary embodiment, the present invention is embodied by an N-channel vertical-gate transistor. In this example, a first conductivity type mentioned in the present invention is an N type and a second conductivity type is a P type. The following description can be similarly applied to a P-channel vertical-gate transistor by inverting the conductivity types of impurity regions in the elements.

Figure 1:
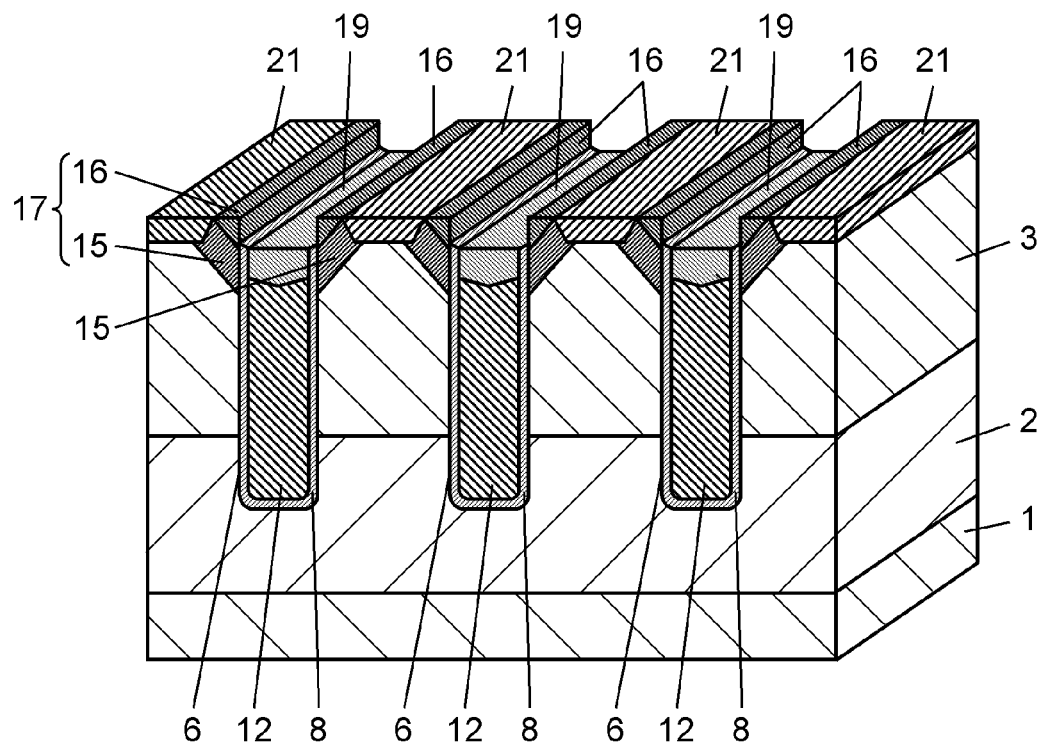
FIG. 1 is a diagram schematically illustrating the configuration of a semiconductor device according to an exemplary embodiment of the present invention.

FIG. 1 is a diagram schematically illustrating the configuration of a semiconductor device according to an exemplary embodiment of the present invention. In FIG. 1, a source electrode and a structure thereon are not shown. FIG. 1 is a schematic diagram and the dimensional ratio of constituents is not limited to one shown in the drawing.

As shown in FIG. 1, the semiconductor device with vertical gate according to this exemplary embodiment includes N-type silicon substrate 1 which is a semiconductor substrate and drain region 2 including an N-type epitaxial silicon layer formed on N-type silicon substrate 1. The impurity concentration of drain region 2 is set to be lower than the impurity concentration of silicon substrate 1. Body region 3 (first body region) including a P-type impurity region with a relatively-low concentration is formed on drain region 2.

In the surface portion of a substrate including N-type silicon substrate 1, drain region 2, and body region 3, plural trenches 6 penetrating body region 3 and reaching drain region 2 are disposed in parallel. Gate electrode 12 formed of polysilicon is embedded in each trench 6 with gate insulating film 8, which is formed of a silicon oxide film, interposed therebetween. The top surface of each gate electrode 12 is lower than the top end of each trench 6. In this example, each trench 6 has a width of about 0.18 μm and a depth of about 0.8 μm. Trenches 6 are arranged with a pitch of 0.6 μm.

Source region 17 formed of an N-type impurity region is formed in the surface portion of the substrate (the surface portion of body region 3) adjacent to each trench 6. Source region 17 includes first source region 15 and second source region 16 and is disposed along trench 6 so as to be adjacent to the top of gate electrode 12 and trench 6.

First source region 15 is configured such that the width of the impurity region in the direction perpendicular to the side wall of trench 6 decreases with an increase in distance from the surface in the depth direction of trench 6, and is disposed up to the depth position adjacent to the top of gate electrode 12. Second source region 16 is disposed on first source region 15 along trench 6. Second source region 16 has an impurity concentration higher than that of first source region 15. As shown in FIG. 1, second source region 16 is formed on the side wall of trench 6 above the top of gate electrode 12. More specifically, second source region 16 is exposed from a region (hereinafter, referred to as an upper side wall portion) extending from the top of trench 6 by a predetermined depth and a region extending from an end of trench 6 by a predetermined distance in the substrate surface. Hereinafter, the region in which second source region 16 is formed is referred to as a top corner portion of trench 6.

Body contact region 21 (second body region) which is adjacent to source region 17 (second source region 16 in the example shown in FIG. 1) and which is formed of a P-type impurity region along source region 17 is disposed in the surface portion of body region 3. Body contact region 21 has an impurity concentration higher than that of body region 3 and is electrically connected to body region 3.

Source region 17 and body contact region 21 are electrically connected to each other by a conductive film (not shown) formed on the top surface thereof.

For example, body region 3 has an impurity concentration of about $1.5 \times 10^{17}$ cm$^{-3}$ and is intended to control a threshold value of a channel region formed along the side wall of trench 6. Body contact region 21 has an impurity concentration of about $1.0 \times 10^{20}$ cm$^{-3}$ and is intended to constitute an ohmic contact with the conductive film. First source region 15 has an impurity concentration of about $2.0 \times 10^{20}$ cm$^{-3}$ and constitutes a source region of a transistor. Second source region 16 has an impurity concentration of about $1.0 \times 10^{21}$ cm$^{-3}$ and is intended to constitute an ohmic contact with the conductive film.

Embedded insulating film 19 is formed in trench 6 on gate electrode 12. Embedded insulating film 19 has a function of electrically separating the conductive film, which connects source region 17 and body contact region 21, from gate electrode 12. In the semiconductor device with vertical gate according to this exemplary embodiment, embedded insulating film 19 includes the same type of impurities as the N-type impurities constituting second source region 16 at least in the lower portion thereof. Embedded insulating film 19 includes the same type of impurities as the P-type impurities constituting body contact region 21 at least in the upper portion thereof.

FIGS. 2 to 19 are cross-sectional process views illustrating processes of forming the semiconductor device with vertical gate having the above-mentioned structure. In FIGS. 2 to 19, a transistor formation region is shown on the left side and a peripheral region (transistor non-forming region) of the transistor forming region in which interconnections such as a gate drawing interconnection are formed is shown in on the right side. Similarly to FIG. 1, FIGS. 2 to 19 are schematic diagrams and dimensional ratios of constituent parts are not limited to the drawings. Hereinafter, if a thin film is formed on a top surface, it is mentioned that a film is formed on a substrate.

Figure 2:
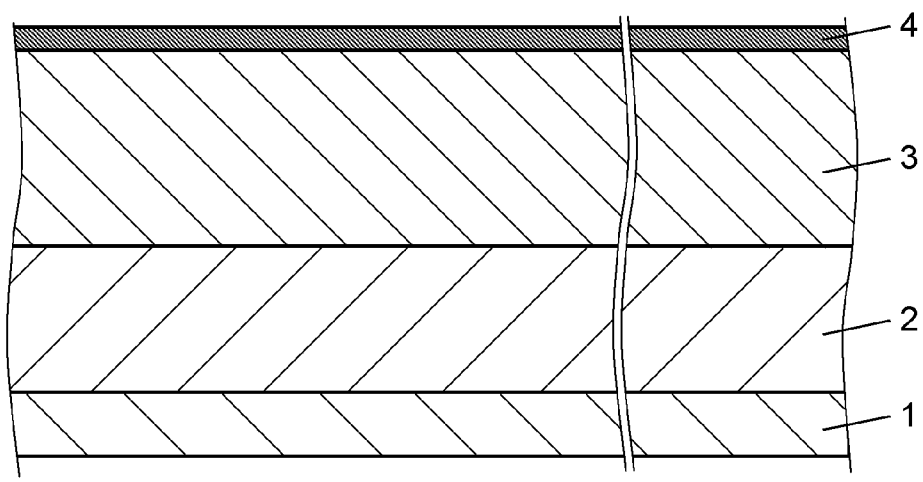
FIG. 2 is a cross-sectional view illustrating a process of manufacturing a semiconductor device according to an exemplary embodiment of the present invention.

As shown in FIG. 2, first, an N-type epitaxial silicon layer is formed on N-type silicon substrate 1 through an epitaxial growth method. P-type impurities are introduced into the surface portion of the epitaxial silicon layer to form N-type drain region 2 and P-type body region 3 on N-type silicon substrate 1. For example, the thickness of drain region 2 can be set to a range of 1 μm to 20 μm and the thickness of body region 3 can be set to a range of 0.5 μm to 2 μm. Drain region 2 and body region 3 may be formed through an epitaxial growth method.

Figure 3:
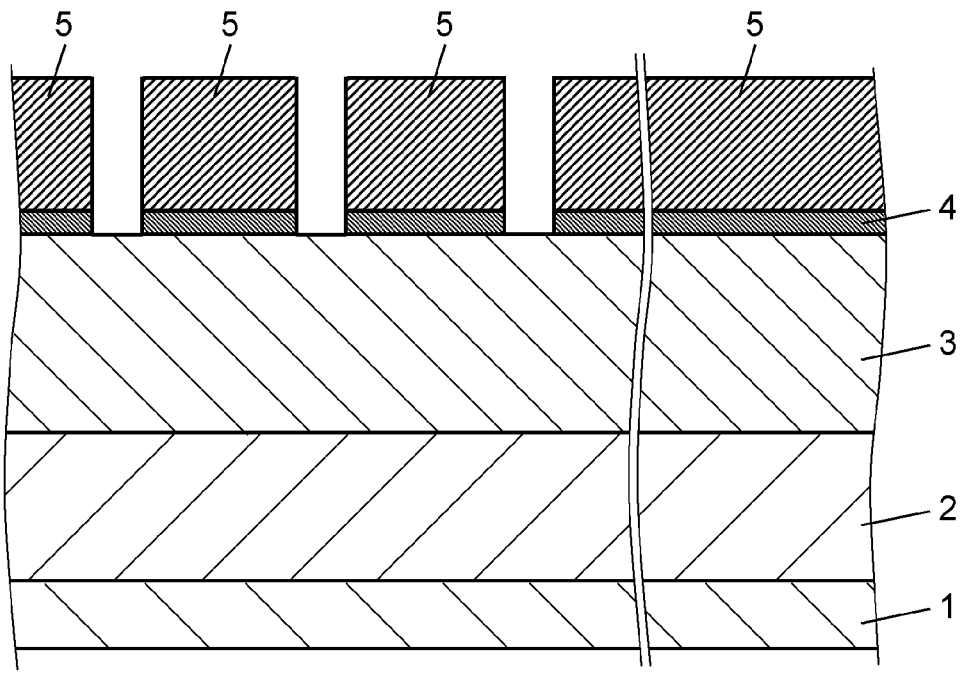
FIG. 3 is a cross-sectional view illustrating a process of manufacturing a semiconductor device according to an exemplary embodiment of the present invention.

Subsequently, silicon oxide film 4 with a thickness of 50 nm to 500 nm is formed on the surface of body region 3 through a thermal oxidation method. As shown in FIG. 3, resist pattern 5 having an opening in the region in which trench 6 is formed in the subsequent processes is formed on silicon oxide film 4 through a known lithography technique. Then, as shown in FIG. 3, silicon oxide film 4 in the region in which trench 6 is formed through an etching process using resist pattern 5 as a mask.

Figure 4:
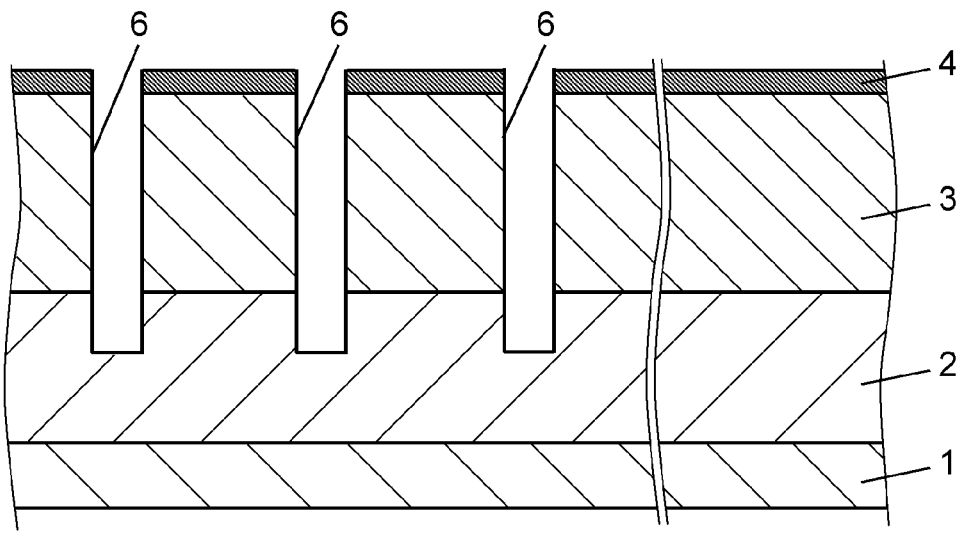
FIG. 4 is a cross-sectional view illustrating a process of manufacturing a semiconductor device according to an exemplary embodiment of the present invention.

After resist pattern 5 is removed, as shown in FIG. 4, trench 6 with a depth of 0.5 μm to 3 μm penetrating body region 3 and reaching drain region 2 is formed through a dry etching process using patterned silicon oxide film 4 as a mask. The width of trench 6 can be set to a range of 0.15 μm to 0.5 μm and the pitch thereof can be set to a range of 0.4 μm to 1.5 μm.

Figure 5:
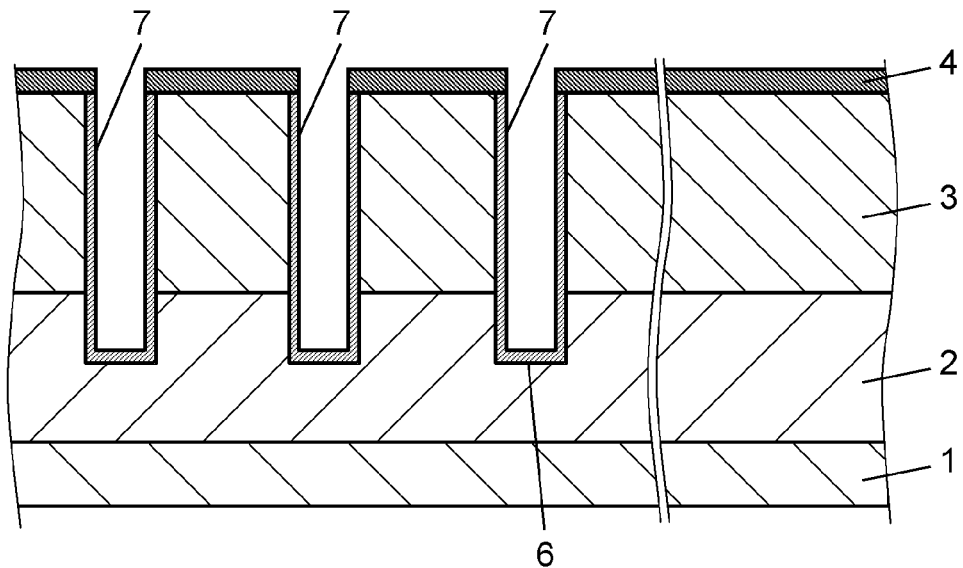
FIG. 5 is a cross-sectional view illustrating a process of manufacturing a semiconductor device according to an exemplary embodiment of the present invention.
Figure 6:
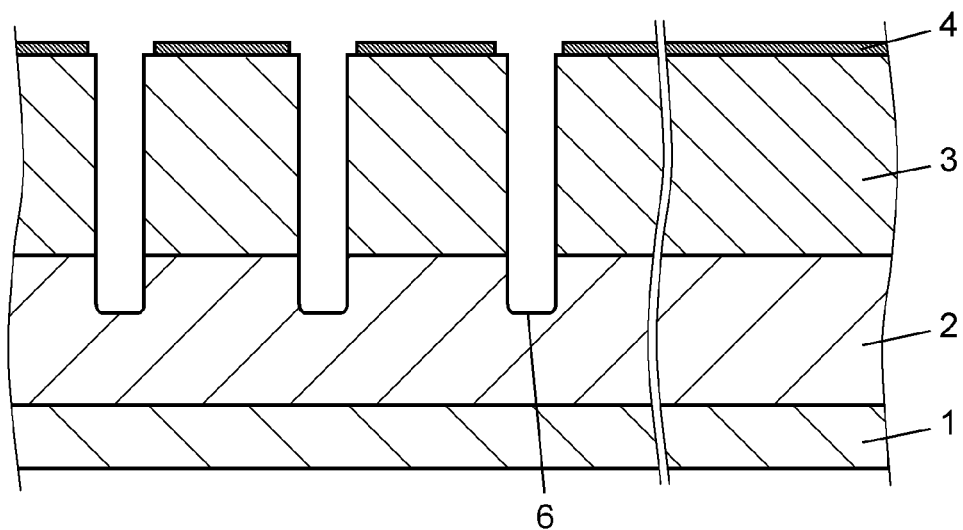
FIG. 6 is a cross-sectional view illustrating a process of manufacturing a semiconductor device according to an exemplary embodiment of the present invention.

As shown in FIG. 5, silicon oxide film 7 with a thickness of about 15 nm to 100 nm is formed on the inner surface of each trench 6 through a thermal oxidation method. Silicon oxide film 7 is removed through a wet etching process or the like, as shown in FIG. 6. In this way, by removing silicon oxide film 7 temporarily formed thereafter, damage of the inner surface of trench 6 due to the dry etching process can be removed. When removing silicon oxide film 7, silicon oxide film 4 on the substrate surface is also etched. In this exemplary embodiment, the thickness of silicon oxide film 4 is set such that a part of silicon oxide film 4 remains even after etching silicon oxide film 7.

Figure 7:
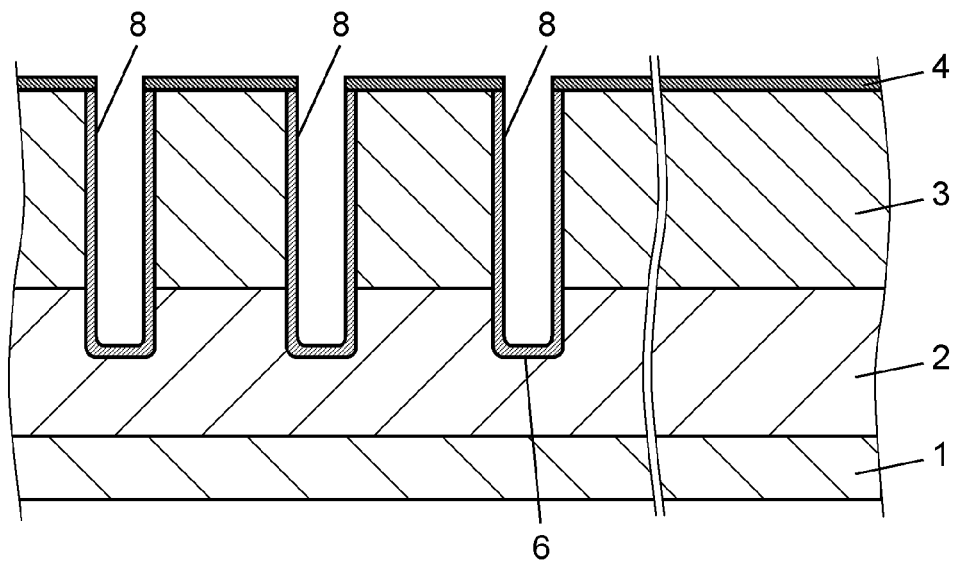
FIG. 7 is a cross-sectional view illustrating a process of manufacturing a semiconductor device according to an exemplary embodiment of the present invention.

Subsequently, as shown in FIG. 7, gate insulating film 8 with a thickness of 8 nm to 100 nm is formed on the inner surface of each trench 6. Although not particularly limited, a silicon oxide film is formed as gate insulating film 8 through a thermal oxidation method herein.

Figure 8:
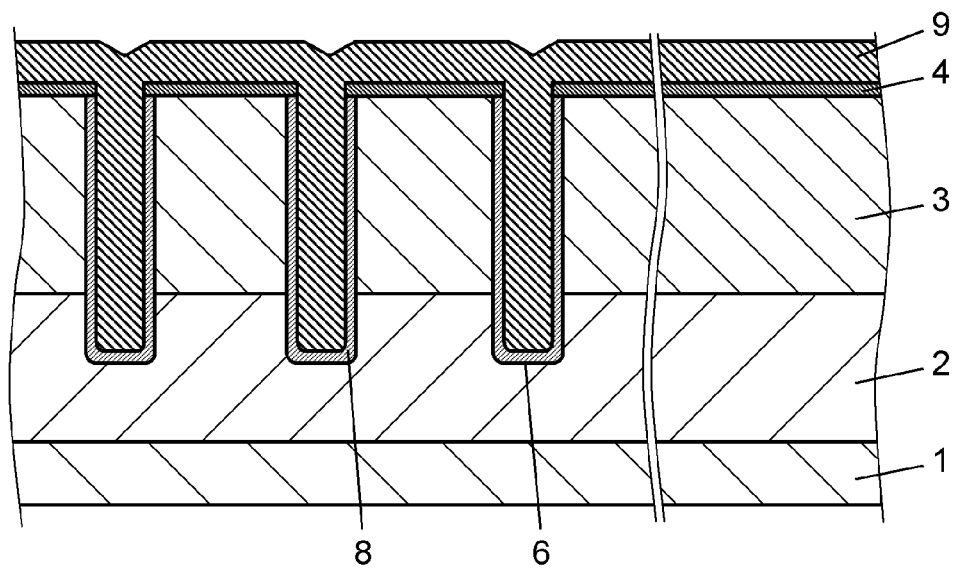
FIG. 8 is a cross-sectional view illustrating a process of manufacturing a semiconductor device according to an exemplary embodiment of the present invention.

Thereafter, as shown in FIG. 8, conductive polysilicon film 9 with a thickness of 200 nm to 800 nm serving as a material of the gate electrode is deposited on the entire surface. A polysilicon film given conductivity can be used as polysilicon film 9. For example, a doped polysilicon film doped with impurities such as phosphorous can be formed through a CVD (Chemical Vapor Deposition) method. Otherwise, the polysilicon film may be formed by forming a non-doped polysilicon film and then performing an N-type impurity ion implanting process and an annealing process.

Figure 9:
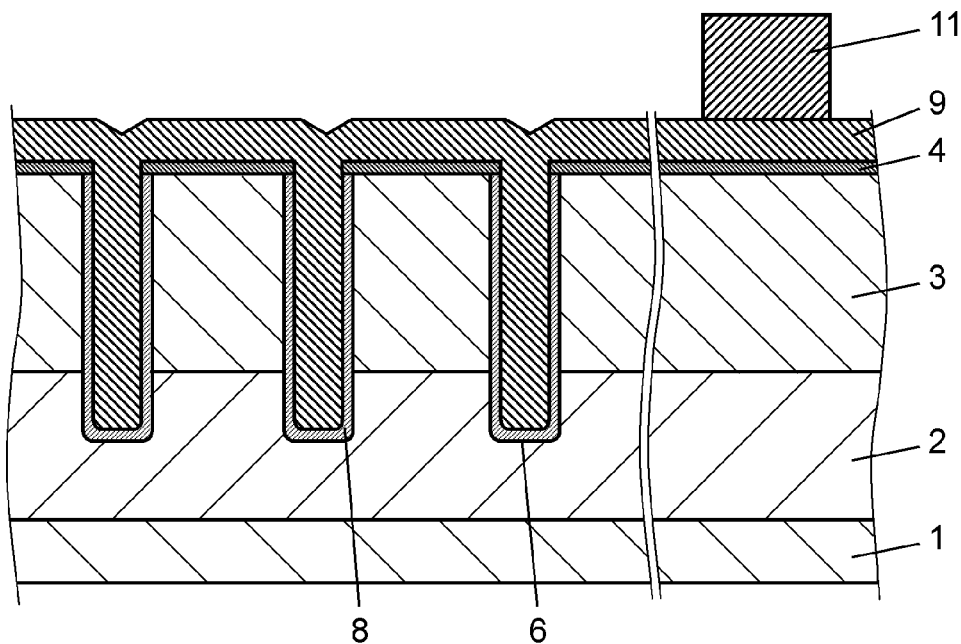
FIG. 9 is a cross-sectional view illustrating a process of manufacturing a semiconductor device according to an exemplary embodiment of the present invention.
Figure 10:
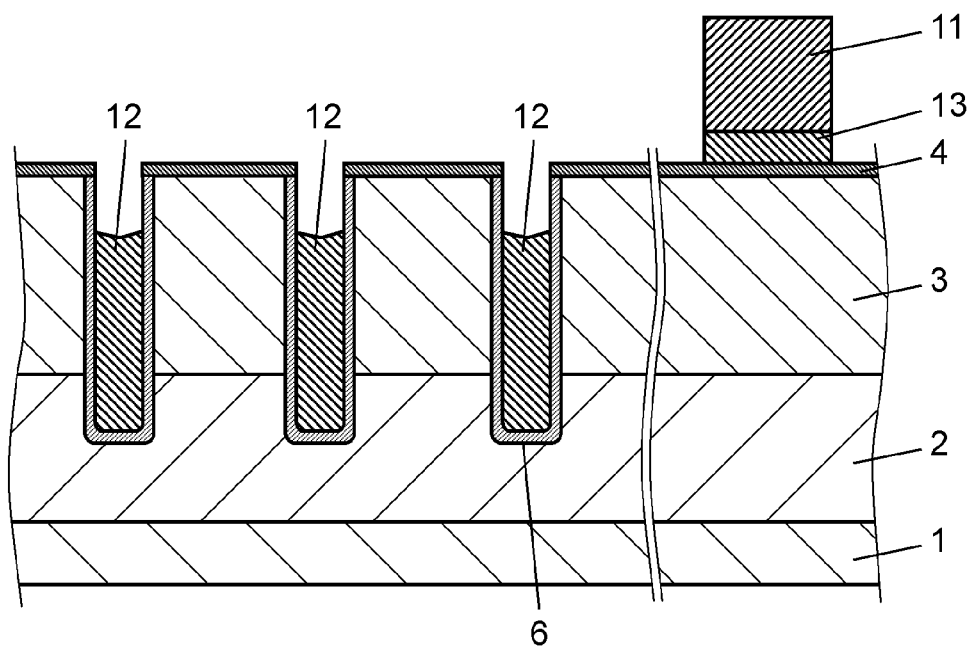
FIG. 10 is a cross-sectional view illustrating a process of manufacturing a semiconductor device according to an exemplary embodiment of the present invention.

Subsequently, as shown in FIG. 9, resist pattern 11 covering a polysilicon interconnection forming region of a gate drawing interconnection or the like is formed. Then, as shown in FIG. 10, polysilicon film 9 on silicon oxide film 4 and trench 6 is removed by etching polysilicon film 9 using resist pattern 11 as a mask. Through this etching, polysilicon film 9 is removed such that the top surface of the polysilicon film in trench 6 is located lower by 100 nm to 500 nm than the surface of silicon oxide film 4. Accordingly, gate electrode 12 is formed in trench 6 in a state where a concave portion remains in the upper portion of trench 6. At the same time, polysilicon interconnection 13 is formed in the transistor non-forming region. Here, polysilicon interconnection 13 constitutes a gate drawing interconnection connected to gate electrode 12 in trench 6, for example, at an end in the length direction of trench 6.

Figure 11:
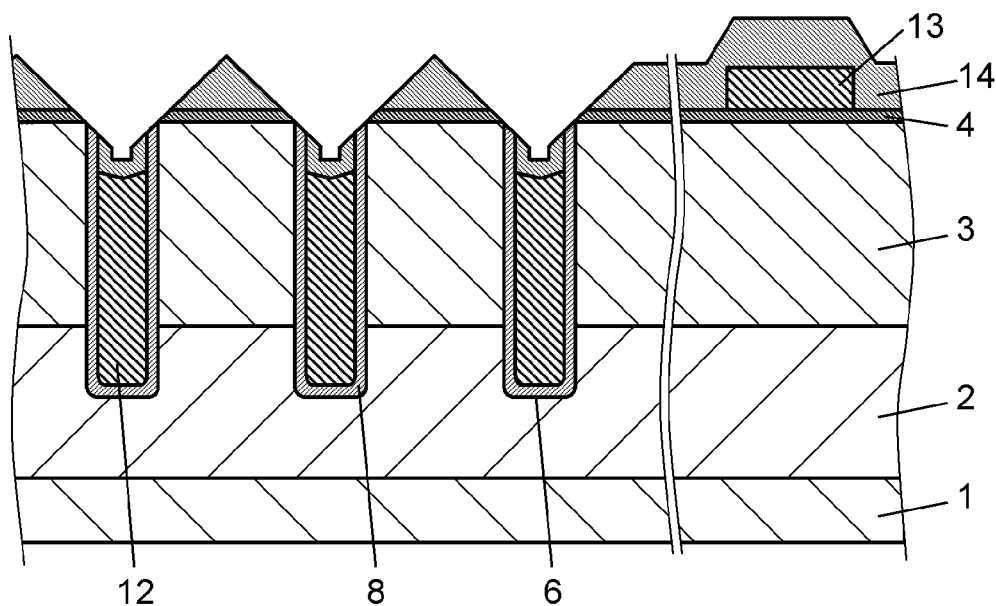
FIG. 11 is a cross-sectional view illustrating a process of manufacturing a semiconductor device according to an exemplary embodiment of the present invention.

After resist pattern 11 is removed, as shown in FIG. 11, first insulating film 14 is formed on the substrate. First insulating film 14 fills the concave portion on gate electrode 12 and has a portion of which the thickness increases with an increase in distance from an end of trench 6 on the substrate surface on both sides of trench 6. First insulating film 14 has only to be formed in the concave portion on gate electrode 12 but does not have to fully fill the concave portion. The thickness-increasing portion of first insulating film 14 preferably has a forward tapered shape with a slope of which the angle with respect to the substrate surface is in a range of 30° to 60°. This is intended to excellently form first source region 15 having a structure which is deep in the vicinity of the upper side wall of trench 6 to be formed in the subsequent processes and which becomes shallower with an increase in distance in the horizontal direction from the top of trench 6. When the angle of the thickness-increasing portion of first insulating film 14 with respect to the substrate surface is smaller than 30°, an N-type impurity region with a relatively-high concentration is formed in the central part between adjacent trenches 6. When the angle of the thickness-increasing portion of first insulating film 14 with respect to the substrate surface is larger than 60°, the width of the source region in the horizontal direction decreases and thus the contact resistance with the source electrode increases.

First insulating film 14 can be deposited in a state where high-frequency power is applied to the substrate, for example, through the use of an HDP-CVD (High Density Plasma-CVD) method. When forming a film using the HDP-CVD method, the deposition of a film and the sputter-etching of the film (Ar sputtering) are performed at the same time. The efficiency of the sputter-etching depends on an incidence angle of particles on the film and an etching rate on an inclined surface of which the angle with respect to the substrate surface is about 50° is high. In the sputter-etching, the etching rate on the vertical surface (90°) such as the side wall of trench 6 or the flat surface (0°) of the substrate is low. As a result, as shown in FIG. 11, first insulating film 14 having the thickness-increasing portion of a forward tapered shape can be formed well. The relationship (strength) between the deposition of a film and the sputter-etching during formation of the film can be also changed by adjusting the flow rate of source gas introduced at the time of depositing first insulating film 14 and high-frequency power to be applied at the time of the deposition. Here, since the etching efficiency has the above-mentioned tendency, the angle formed by the inclined surface and the substrate surface converges on 50° with the elapse of process time.

In forming a film using the HDP-CVD, the thickness of first insulating film 14 can be set to the same degree as the depth (the distance from the substrate surface to the surface of the gate electrode) of the concave portion on gate electrode 12 or a thickness lower than the top of trench 6. By employing this configuration, the inclined surface (the top surface of the thickness-increasing portion) can be brought in contact with the top of trench 6 or can be disposed in the vicinity of the top of trench 6. Accordingly, first source region 15 can be formed well in the subsequent process. In this exemplary embodiment, since the depth of the concave portion on gate electrode 12 is in the range of about 100 nm to 500 nm, the thickness of first insulating film 14 can be set to a range of 100 nm to 500 nm. Although particularly limited, a silicon oxide film is deposited as first insulating film 14 in this exemplary embodiment.

Figure 12:
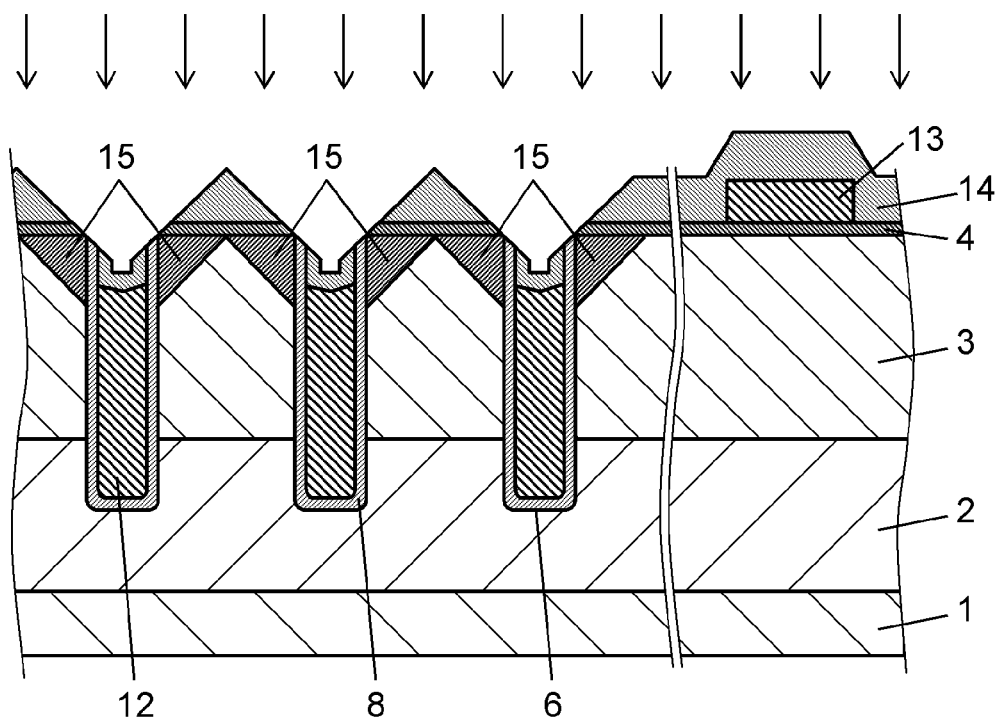
FIG. 12 is a cross-sectional view illustrating a process of manufacturing a semiconductor device according to an exemplary embodiment of the present invention.

Subsequently, as shown in FIG. 12, by introducing N-type impurities using first insulating film 14 and silicon oxide film 4 formed in this way as a mask, first source region 15 is formed. The introduction of impurities can be carried out by ion implantation. In the ion implantation, it is preferable that impurities be incident perpendicularly on the substrate. At this time, an acceleration voltage of the ion implantation preferably employs an acceleration voltage with which the impurities do not penetrate a large-thickness portion of first insulating film 14 and silicon oxide film 4 below the large-thickness portion and an acceleration voltage with which the impurities are introduced into the region adjacent to the top of gate electrode 12 in the vicinity of the side wall of trench 6. The large-thickness portion of first insulating film 14 means a portion of first insulating film 14, which is formed on the flat substrate surface between trench 6 and adjacent trench 6 without an influence of trench 6. The thickness of the large-thickness portion is substantially equal to the thickness of first insulating film 14 deposited in a portion of which the top surface is a horizontal surface parallel to the semiconductor substrate.

For example, a case where the top surface of gate electrode 12 is located lower by 250 nm than the substrate surface and first insulating film 14 of which the thickness of the large-thickness portion is 180 nm is deposited on the substrate will be described below. First, ion implantation through first insulating film 14 is performed using phosphorous as N-type impurities. When implantation energy is set to 70 KeV and implantation dose is set to $8.0 \times 10^{15}$ cm$^{-2}$, the projected range Rp of phosphorous ions in the silicon oxide film is 0.0688 μm and the variance σ is 0.0283 μm. That is, Rp+3σ=0.1537 μm and phosphorous ions hardly reach body region 3 just below the large-thickness portion of first insulating film 14 with a thickness of 180 nm. On the other hand, in the thickness-increasing portion of first insulating film 14, more phosphorous ions than those of a small-thickness portion reach body region 3 just below. As a result, first source region 15 is formed which has a structure which is deep in the vicinity of the side wall of trench 6 and which becomes shallower with an increase in distance from the top of trench 6 in the horizontal direction. More strictly, in a portion with a very small thickness of first insulating film 14 in the vicinity of the side wall of trench 6, the impurity concentration profile in the depth direction of first source region 15 exhibits a Gaussian distribution having a peak at a position lower than the substrate surface. The peak depth is a depth based on the projected range of impurity ions in the silicon substrate. Since first insulating film 14 slowly increases with an increase in distance from the top of trench 6 in the horizontal direction, the peak depth of the impurity concentration profile in the depth direction of first source region 15 gradually becomes shallower and the peak concentration thereof becomes smaller. That is, in the substrate surface, an impurity concentration profile in which the impurity concentration slowly decreases with an increase in distance from the top of trench 6 in the horizontal direction is exhibited. That is, in first source region 15, the width of the impurity region in the direction perpendicular to the side wall of trench 6 decreases with an increase in distance from the substrate surface in the depth direction of trench 6 and the impurity concentration increases with a decrease in distance from the top of the side wall of trench 6.

In this case, the interface between first source region 15 and body region 3 has a planar shape inclined with respect to the side wall of trench 6. Since impurities introduced into the silicon substrate diffuse at the time of activation annealing, the impurity concentration distribution after the activation annealing is not strictly matched with the impurity concentration distribution just after the ion implantation. Here, the "planar shape inclined with respect to the side wall of trench 6" means that the impurity concentration distribution just after the ion implantation of first source region 15 is the impurity concentration distribution reflecting the shape of the thickness-increasing portion of first insulating film 14 having an inclined planar shape.

Figure 13:
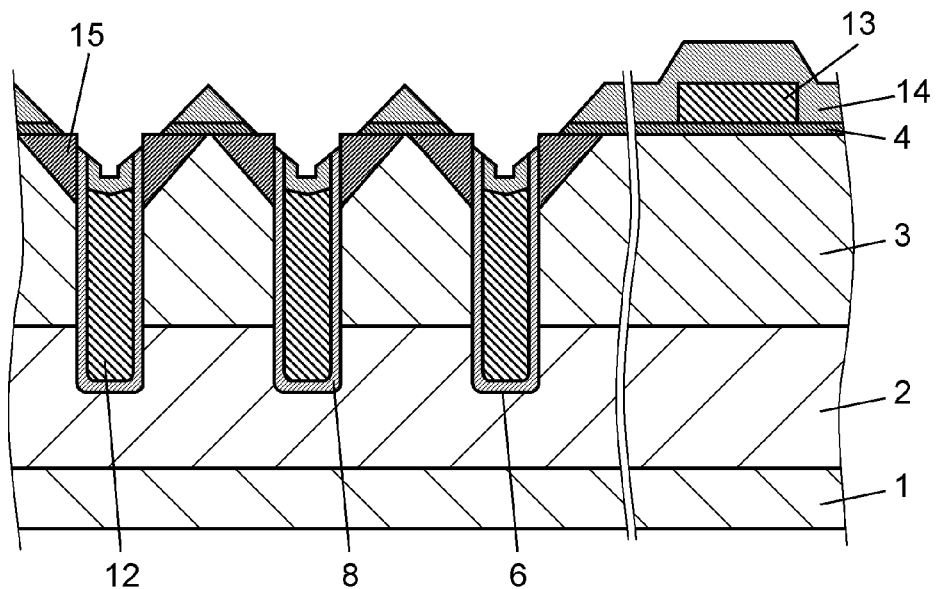
FIG. 13 is a cross-sectional view illustrating a process of manufacturing a semiconductor device according to an exemplary embodiment of the present invention.

When the ion implantation of phosphorous is completed, as shown in FIG. 13, a stacked film including silicon oxide film 4 and first insulating film 14 is etched back to expose the corners of the top of trench 6. At this time, the amount of etched-back film can be set to a range of 20 nm to 100 nm. Although not particularly limited, the amount of etched-back film is set to about ⅓ of the stacked thickness of silicon oxide film 4 and first insulating film 14 in this exemplary embodiment. For example, when each trench 6 has a width of 0.18 µm, the trenches are arranged with a pitch of 0.6 µm, and the thickness of the stacked film including silicon oxide film 4 and first insulating film 14 is 250 nm, the amount of etched-back film is about 80 nm. At this time, the exposed width of the substrate surface in the horizontal direction from an end of trench 6 is about 0.1 µm. Any of a dry etching process and a wet etching process may be used for the etching-back.

Figure 14:
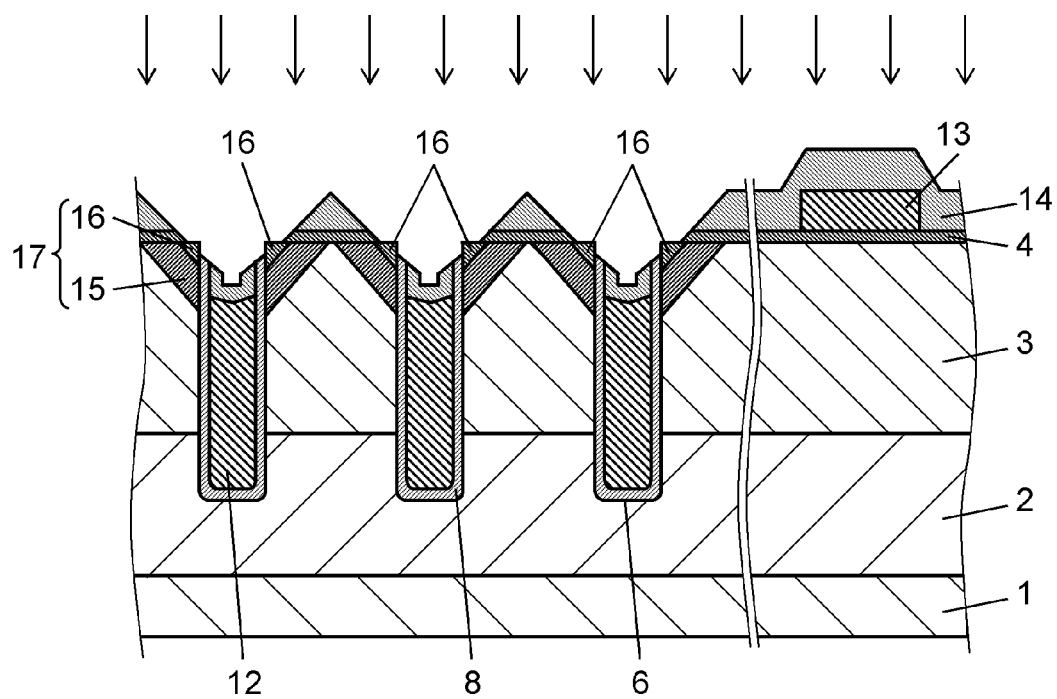
FIG. 14 is a cross-sectional view illustrating a process of manufacturing a semiconductor device according to an exemplary embodiment of the present invention.

As shown in FIG. 14, second source region 16 is formed by introducing N-type impurities using the etched-back stacked film of silicon oxide film 4 and first insulating film 14 as a mask. The introduction of impurities can be carried out by ion implantation. In the ion implantation, the impurities are preferably incident perpendicularly on the substrate. Here, by carrying out the ion implantation using arsenic as N-type impurities, second source region 16 is formed. When the ion implantation is carried out with implantation energy 50 KeV and implantation dose of $8.0 \times 10^{15}$ cm$^{-2}$, the projected range and the variance of arsenic ions in the silicon substrate are smaller those of phosphorous ions. Accordingly, second source region 16 formed in body region 3 through the ion implantation is included in first source region 15 formed through the ion implantation of phosphorous ions. In the region in which the substrate surface is exposed, impurities are introduced into the substrate without being hindered by silicon oxide film 4 or first insulating film 14. As a result, second source region 16 with a higher concentration can be formed at the corners of the top of trench 6 through the ion implantation of arsenic. A shape corresponding to the exposed substrate surface appears on the bottom of second source region 16, but an influence of impurities or the like introduced through the side wall of exposed trench 6 in this example acts thereon. Accordingly, as shown in FIG. 14, second source region 16 has a shape in which the width of the impurity region in the direction perpendicular to the side wall of trench 6 with an increase in distance in the depth direction of trench 6 from the surface.

In the ion implantation, at least N-type impurities constituting second source region 16 are introduced into first insulating film 14 formed on gate electrode 12 in trench 6.

As described above, in this exemplary embodiment, source region 17 disposed along trench 6 can be formed to be adjacent to the top of gate electrode 12 and trench 6 without using a lithography technique. That is, in the shape, the width of the impurity region in the direction perpendicular to the side wall of trench 6 decreases with an increase in distance in the depth direction of trench 6 from the surface. Regarding the impurity concentration, as it gets closer to the top of the side wall of trench 6, the impurity concentration increases. First source region 15 described above can be formed in a self-alignment manner. Second source region is disposed in a region including the substrate surface on both sides of trench 6, on the top of first source region 15, extending by a predetermined distance from an end of trench 6 and the side wall of trench 6, on first source region 15, extending by a predetermined depth from the top of trench 6. In this way, second source region 16 with an impurity concentration higher than that of first source region 15 can be formed in a self-alignment manner.

When a P-type body contact region can be formed through introduction of P-type impurities to be described later, adjacent first source regions 15, which are formed in the process of forming source region 17, may be separated from or connected to each other between adjacent trenches 6. Since second source region is formed through the introduction of impurities using etched-back first insulating film 14 and silicon oxide film 4 as a mask, a high-concentration N-type impurity region is not formed in the region in which the body contact region is formed.

Figure 15:
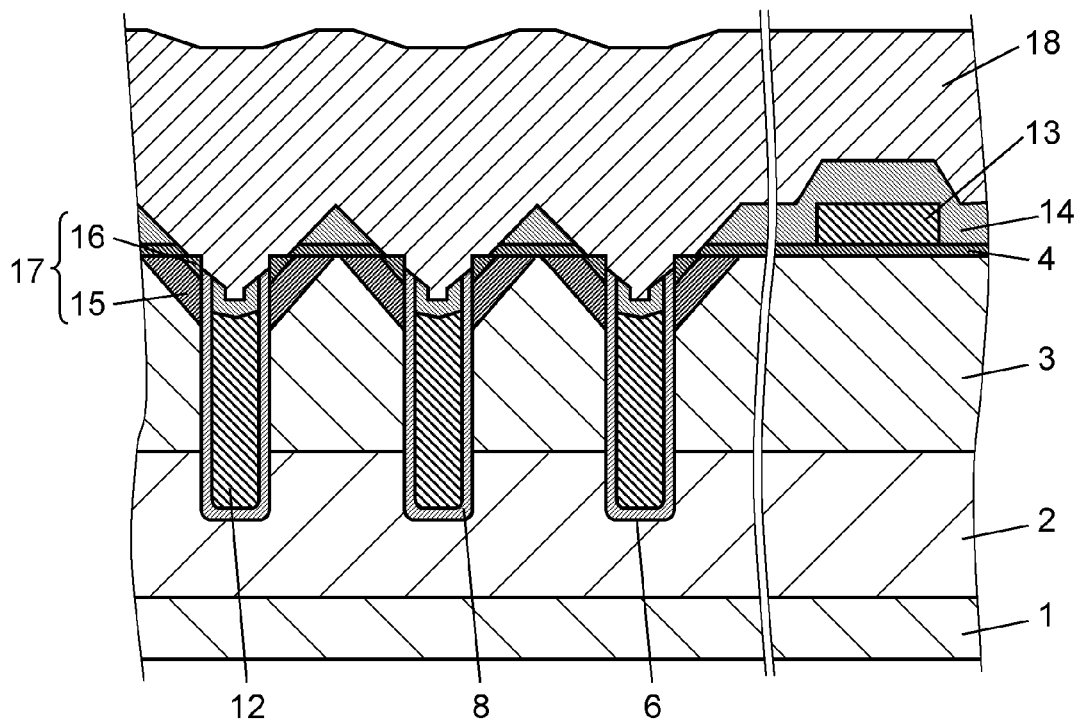
FIG. 15 is a cross-sectional view illustrating a process of manufacturing a semiconductor device according to an exemplary embodiment of the present invention.

After source region 17 including first source region 15 and second source region 16 is formed as described above, second insulating film 18 serving as a planarization film reducing unevenness of the substrate is deposited on the substrate as shown in FIG. 15. Although not particularly limited, a silicon oxide film with a thickness of about 500 nm to 1500 nm is deposited as second insulating film 18 in this exemplary embodiment.

Figure 16:
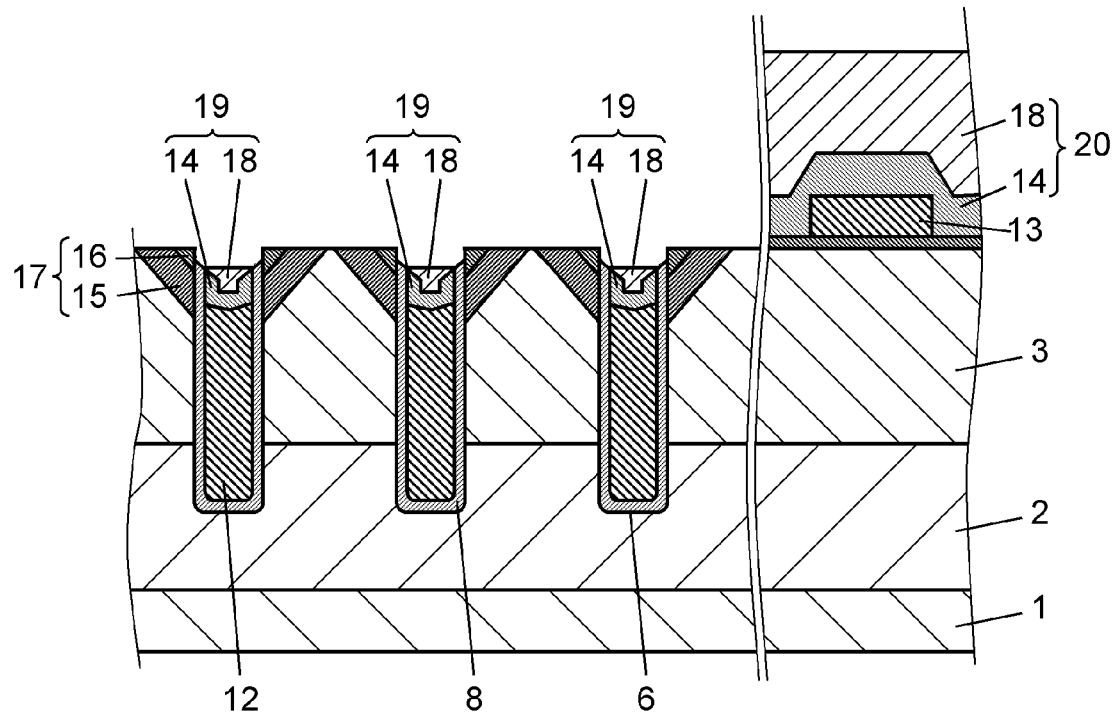
FIG. 16 is a cross-sectional view illustrating a process of manufacturing a semiconductor device according to an exemplary embodiment of the present invention.

Subsequently, as shown in FIG. 16, second insulating film 18, first insulating film 14, and silicon oxide film 4 on body region 3 and source region 17 are removed through a dry etching process. This etching is carried out in a state where an etching mask including a resist pattern is disposed on second insulating film 18 covering the polysilicon interconnection part such as a transistor non-forming region. In the etching, the stacked insulating film including first insulating film 14 and second insulating film 18 filled on gate electrode 12 is etched in a state where it is located lower than the top of trench 6. The stacked insulating film filled on gate electrode 12 becomes an embedded insulating film 19 filling the top side of gate electrode 12 in trench 6. On the contrary, the stacked insulating film covered with a resist pattern remains as interlayer insulating film 20 on the substrate. The stacked insulating film on the semiconductor substrate on which the resist pattern is not disposed is removed to expose the substrate surface. The resist pattern is not limited to the polysilicon interconnection part on the substrate but can be disposed to cover the region in which interlayer insulating film 20 should be formed.

As described above, in this exemplary embodiment, source region 17 is formed by the ion implantation through first insulating film 14. Accordingly, the silicon oxide film which is first insulating film 14 of the stacked insulating film includes the N-type impurities and the silicon insulating film which is second insulating film 18 does not include the N-type impurities. As shown in FIG. 15, the thickness of second insulating film 18 of the stacked insulating film formed between trenches 6 is smaller than the thickness of second insulating film 18 of the stacked insulating film formed on gate electrode 12. Accordingly, when a dry etching condition that the etching rate of first insulating film 14 including the N-type impurities is higher than the etching rate of second insulating film 18 not including the N-type impurities is applied to the dry etching process on the stacked insulating film, the etching rate of the stacked insulating film formed between trenches 6 can be made to be higher than the etching rate of the stacked insulating film formed on gate electrode 12. By employing this dry etching condition, the thickness of embedded insulating film 19 can be made to be larger, compared with the dry etching condition that the stacked insulating film is etched at the same etching rate. That is, since a thick insulating film can be interposed between a source electrode which is later formed on embedded insulating film 19 and gate electrode 12, a decrease in withstanding voltage due to the decrease in thickness of embedded insulating film 19 can be suppressed. In this exemplary embodiment, first insulating film 14 and second insulating film 18 are formed of a silicon oxide film and phosphorous and arsenic ions are implanted into first insulating film 14. Accordingly, in the dry etching process on the silicon oxide film, the etching rate of first insulating film 14 is naturally higher than the etching rate of second insulating film 18. For example, when fluorine-based gas which is generally used to etch a silicon oxide film is used, the etching rate of first insulating film 14 is higher by about 5% than the etching rate of second insulating film 18. In a wet etching process using hydrofluoric acid, the etching rate of first insulating film 14 is twice as high as the etching rate of second insulating film 18.

After depositing second insulating film 18 and before etching the stacked insulating film, the surface of second insulating film 18 may be planarized through a CMP (Chemical Mechanical Polishing) process. Accordingly, the thickness of second insulating film 18 in the stacked insulating film formed between adjacent trenches 6 can be made to be smaller than the thickness of second insulating film 18 in the stacked insulating film formed on gate electrode 12. As a result, embedded insulating film 19 can be more easily formed in each trench 6. Since the thickness of the stacked insulating film to be etched after the CMP process is reduced by employing the CMP process, embedded insulating film 19 can be formed with a reduced thickness difference.

As shown in FIG. 16, the bottom and the side of embedded insulating film 19 are constructed by first insulating film 14 and the top thereof is constructed by second insulating film 18. The bottom of interlayer insulating film 20 is constructed by first insulating film 14 and the top thereof is constructed by second insulating film 18. However, in the subsequent drawings, a single insulating film is shown for the purpose of convenience.

Figure 17:
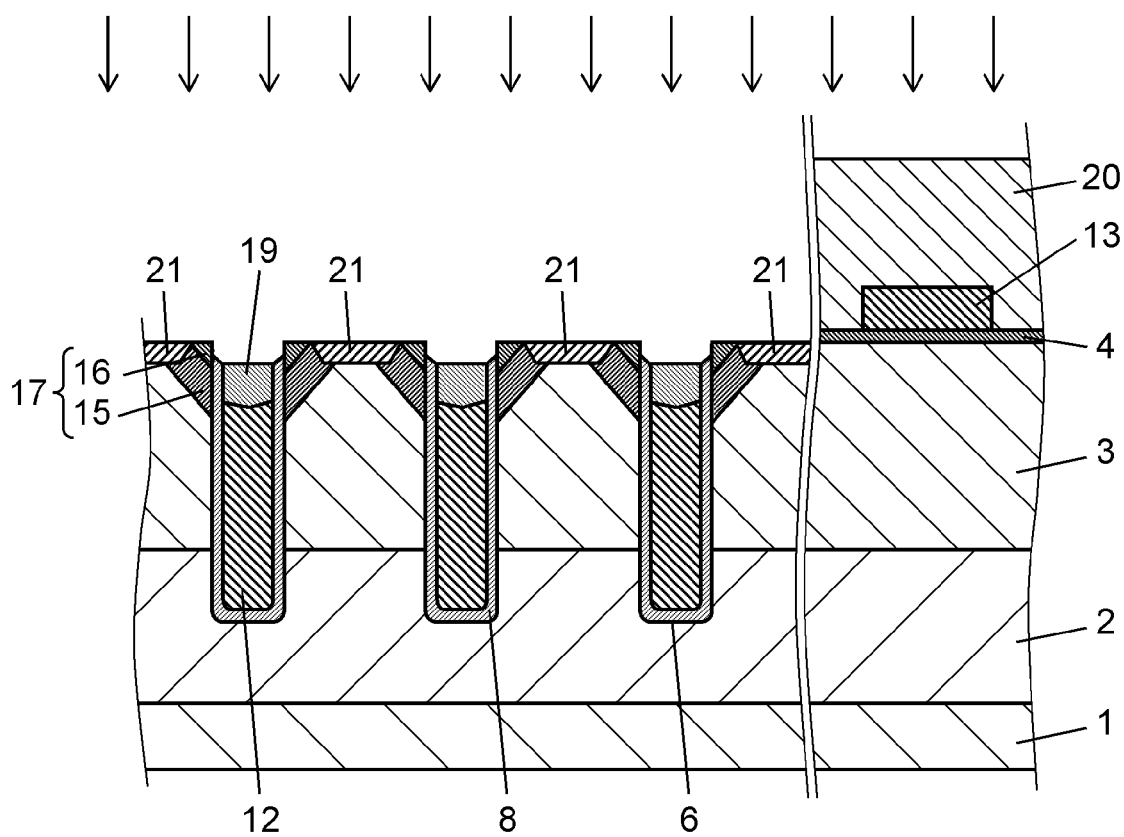
FIG. 17 is a cross-sectional view illustrating a process of manufacturing a semiconductor device according to an exemplary embodiment of the present invention.

When the formation of embedded insulating film 19 is completely, body contact region 21 is formed, as shown in FIG. 17, by introducing P-type impurities through the exposed substrate surface. The introduction of impurities can be carried out by ion implantation to the entire substrate surface. In the ion implantation, the impurities are preferably incident perpendicularly on the substrate. The ion implantation is carried out with an implantation dose by which the impurity polarity in the vicinity of trench 6 of source region 17 is not inverted. Accordingly, P-type body contact region 21 adjacent to source region 17 is formed on the top of body region 3 in a self-alignment manner. In the ion implantation, P-type impurities constituting body contact region 21 are introduced at least into the top of embedded insulating film 19 formed on gate electrode 12 in trench 6.

For example, when source region 17 is formed through the ion implantation under the above-mentioned ion implantation condition and boron is used as the second conductivity type of impurities, body contact region 21 can be formed with implantation energy of 10 KeV and an implantation dose of $4.0 \times 10^{15}$ cm$^{-2}$.

When the formation of body contact region 21 is completed in this way, a conductive film (source electrode) electrically connecting source region 17 and body contact region 21 is formed. Although not particularly limited, the conductive film includes a stacked film of barrier metal film 22 formed of a titanium film (Ti) and a titanium nitride film (TiN) and metal film 23 formed of an aluminum film in this exemplary embodiment.

Figure 18:
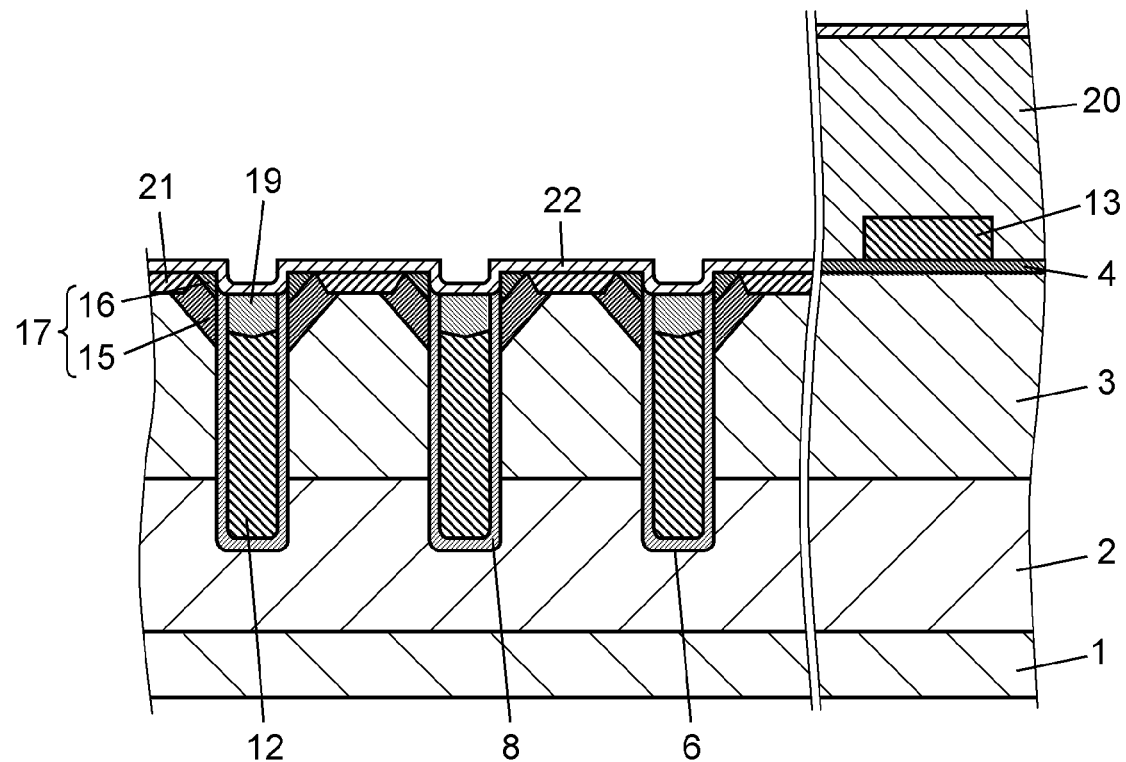
FIG. 18 is a cross-sectional view illustrating a process of manufacturing a semiconductor device according to an exemplary embodiment of the present invention.
Figure 19:
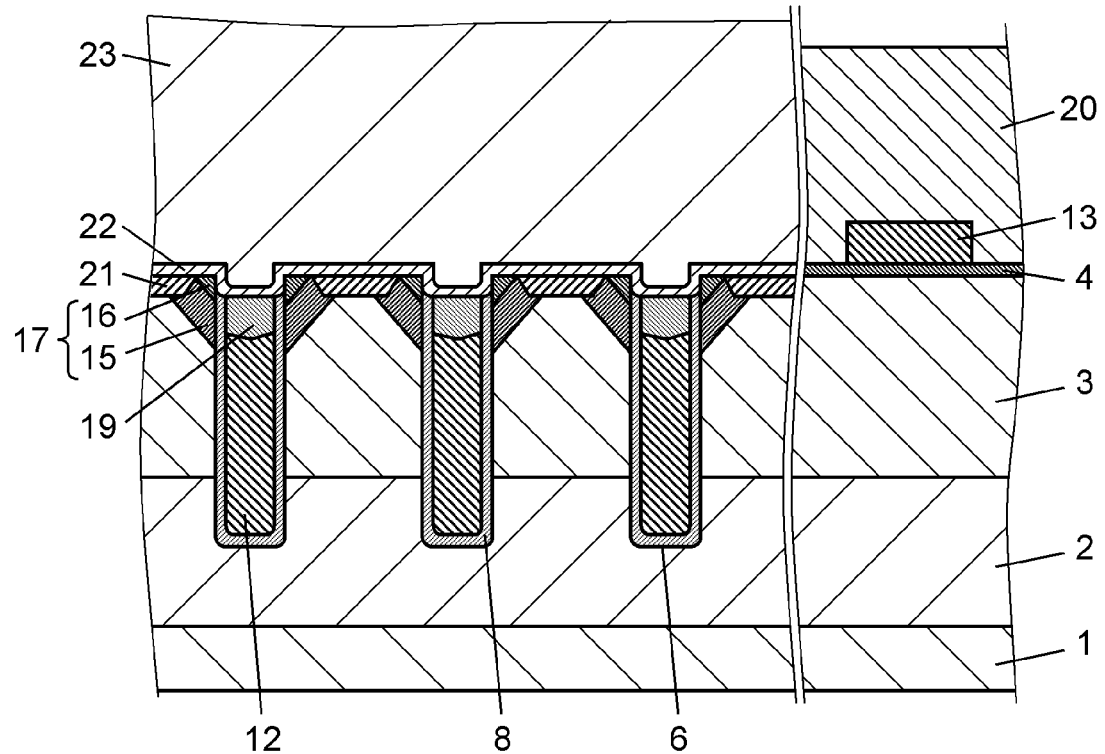
FIG. 19 is a cross-sectional view illustrating a process of manufacturing a semiconductor device according to an exemplary embodiment of the present invention.

First, as shown in FIG. 18, barrier metal film 22 with a thickness of about 20 nm to 150 nm is formed on the substrate on which body contact region 21 is formed through the use of a sputtering method or the like. Then, as shown in FIG. 19, metal film 23 with a thickness of about 1000 nm to 5000 nm is formed on barrier metal film 22 through the use of a sputtering method or the like. By applying a lithography technique and an etching technique to barrier metal film 22 and metal film 23, a conductor pattern of a desired shape is formed and thus a vertical-gate transistor is completed.

As described above, in the semiconductor device with vertical gate according to this exemplary embodiment, source region 17 including first source region 15 and second source region 16 and body contact region 21 can be formed without using a lithography technique. Accordingly, it is not necessary to secure a margin for mask superposition shift and it is possible to form a minute body contact region regardless of capability of lithography equipment. That is, it is possible to reduce the gate electrode pitch, compared with the conventional art. When the gate electrode pitch is further reduced, contact resistance between the source region and the source electrode may increase. However, in this exemplary embodiment, a high-concentration second source region can be disposed at the corners of the top of a trench. Accordingly, it is possible to suppress an increase in contact resistance. As a result, it is possible to implement a semiconductor device with vertical gate with on-resistance smaller than that in the conventional art at a lower cost.

In the semiconductor device with vertical gate according to the conventional art described in Unexamined Japanese Patent Publication No. 2005-209807, a source region is formed through the use of entire-surface ion implantation without using a mask. Accordingly, the impurities constituting source region 112 may be implanted into the surface portion of the silicon substrate outside the transistor forming region in which trench 105 is formed. In this case, a parasitic bipolar transistor having an impurity region as a source region and including body region 103 and drain region 102 is formed in the peripheral region of the transistor forming region. The device may be destroyed due to the operation of the parasitic bipolar transistor.

On the contrary, in the semiconductor device with vertical gate according to this exemplary embodiment, as shown in FIG. 11, the entire substrate surface is covered with first insulating film 14 in the N-type ion implantation process for forming source region 17. Accordingly, the N-type impurities are not introduced into the peripheral region of the transistor forming region. Even if the N-type impurities are introduced, only a low-concentration impurity region is formed and the low-concentration N-type impurity region is inverted to a P-type impurity region through the entire-surface implantation of P-type impurities to be described later. Therefore, in the semiconductor device with vertical gate according to this exemplary embodiment, an n-type impurity region is not formed in the surface portion of the semiconductor substrate outside the transistor forming region and a parasitic bipolar transistor is not formed. As a result, it is possible to reduce the possibility in which a device is destroyed due to the operation of the parasitic bipolar transistor as in the conventional semiconductor device with vertical gate.

In the above-mentioned embodiment, first source region 15 is formed by the impurity introduction through non-etched-back first insulating film 14 and second source region 16 is formed by the impurity introduction through etched-back first insulating film 14. In this configuration, it is possible to form second source region 16 with a high concentration formed at the corners of the top of trench 6 while suppressing the enlargement (diffusion to the region in which body contact region 21 is formed) of first source region 15 in the horizontal direction, which is particularly desirable.

However, first source region 15 may be formed in a self-alignment manner by the impurity introduction through etched-back first insulating film 14, instead of the impurity introduction through non-etched-back first insulating film 14. In this case, both first source region 15 and second source region 16 are formed by the impurity introduction through etched-back first insulating film 14, and a part of first source region 15 is introduced into the substrate through the exposed substrate surface. In this case, since the thickness of the thickness-increasing portion of first insulating film 14 decreases, the enlargement of first source region 15 in the horizontal direction increases, compared with the impurity introduction through non-etched-back first insulating film 14. When the diffusion of N-type impurities into the region in which body contact region 21 is in the allowable range, it is possible to achieve the same operational advantages as in the above-mentioned configuration.

When first source region 15 and second source region 16 are formed by the impurity introduction through etched-back first insulating film 14, the process of forming first insulating film 14 and the process of etching back the stacked film of first insulating film 14 and silicon oxide film 4 are successive. Accordingly, when the process of forming first insulating film 14 and the process of etching back the stacked film of first insulating film 14 and silicon oxide film 4 are carried out by the use of the same apparatus, it is also possible to substantially reduce the number of processes.

In the above-mentioned configuration, the thickness of first insulating film 14 remaining on polysilicon interconnection 13 constituting a gate drawing interconnection or the like may decrease in the process (FIG. 13) of etching back the stacked film of first insulating film 14 and silicon oxide film 4. In this case, the impurities may be introduced into polysilicon interconnection 13 in the process of introducing impurities for forming second source region 16. When the impurities are introduced into polysilicon interconnection 13, the sheet resistance value of polysilicon interconnection 13 may vary to cause an operation difference between unit cells constituting the semiconductor device with vertical gate or a characteristic difference between manufactured semiconductor device with vertical gates. The impurity introduction into polysilicon interconnection 13 may occur even when an implantation acceleration voltage is raised in the ion implantation for forming first source region 15.

Figure 20:
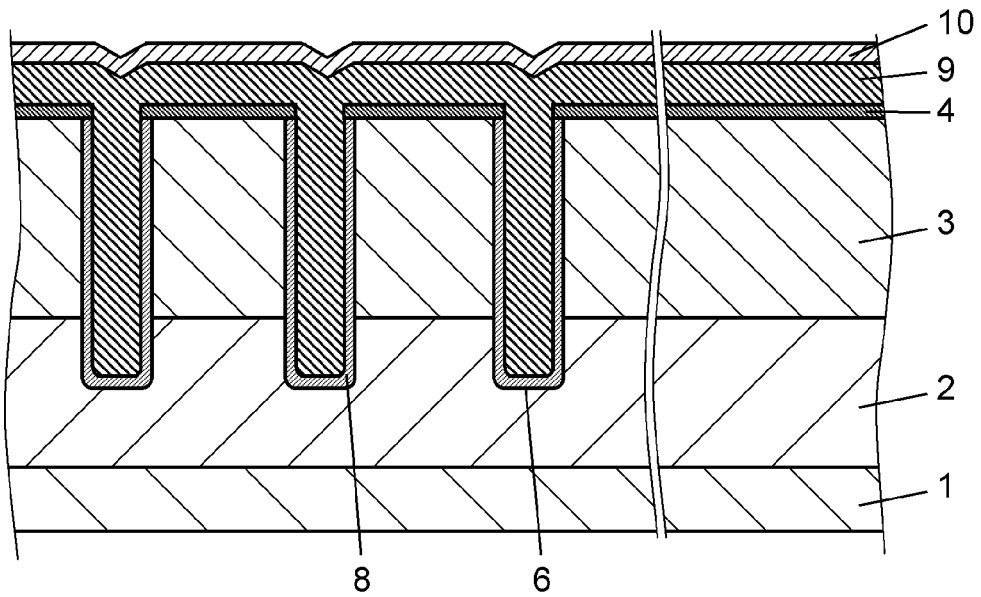
FIG. 20 is a cross-sectional view illustrating a modified example of a semiconductor device according to an exemplary embodiment of the present invention.

Therefore, the following process may be employed. That is, conductive polysilicon film 9 with a thickness of 200 nm to 800 nm which is a material of a gate electrode is deposited on the substrate in the process shown in FIG. 8 and cap insulating film 10 with a thickness of 50 nm to 200 nm is then deposited on the substrate as shown in FIG. 20. Although not particularly limited, the same silicon oxide film as the first insulating film stacked thereon later is used as cap insulating film 10.

Figure 21:
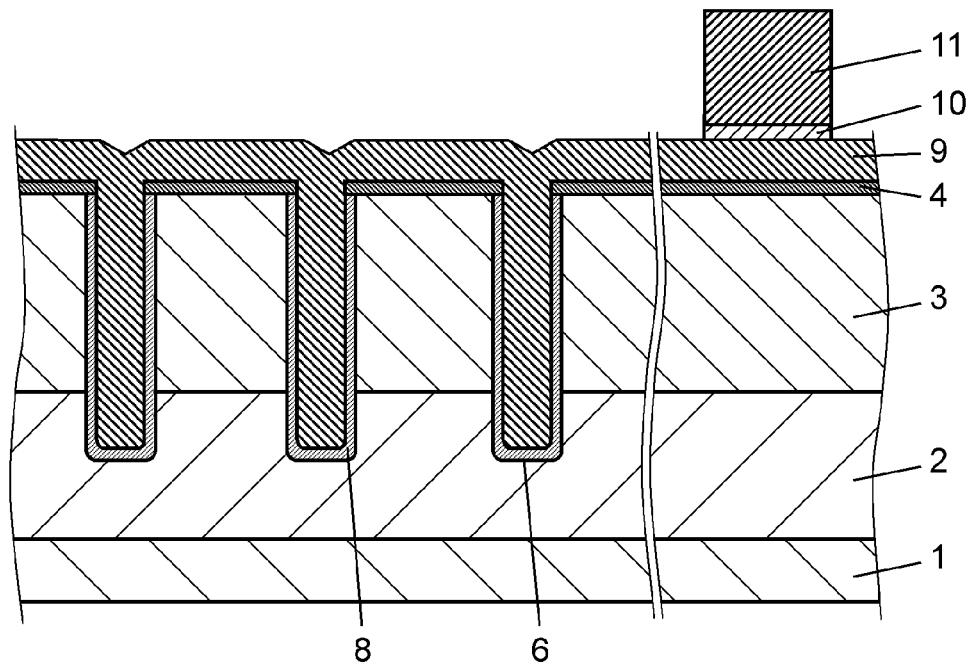
FIG. 21 is a cross-sectional view illustrating a modified example of a semiconductor device according to an exemplary embodiment of the present invention.
Figure 22:
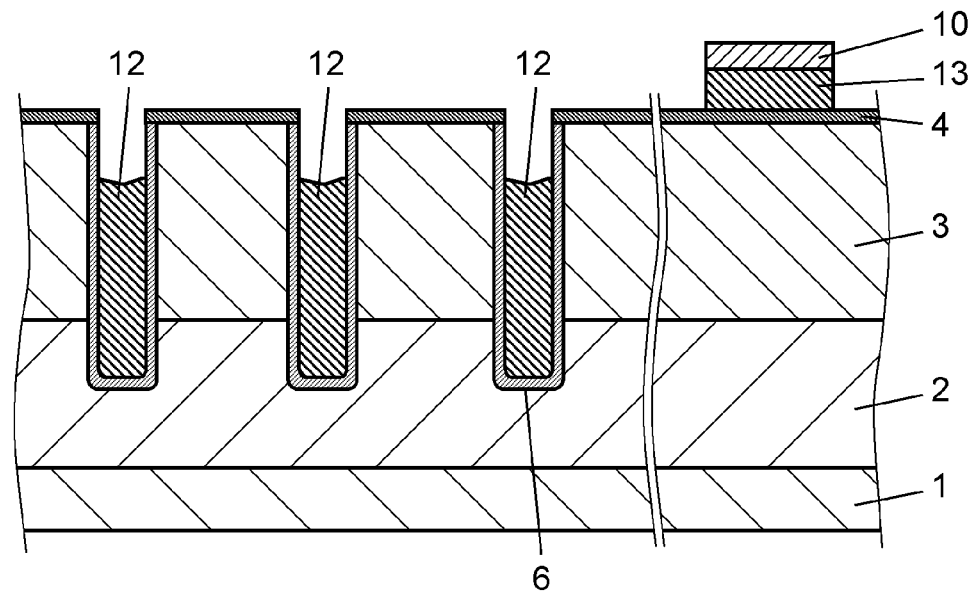
FIG. 22 is a cross-sectional view illustrating a modified example of a semiconductor device according to an exemplary embodiment of the present invention.
Figure 23:
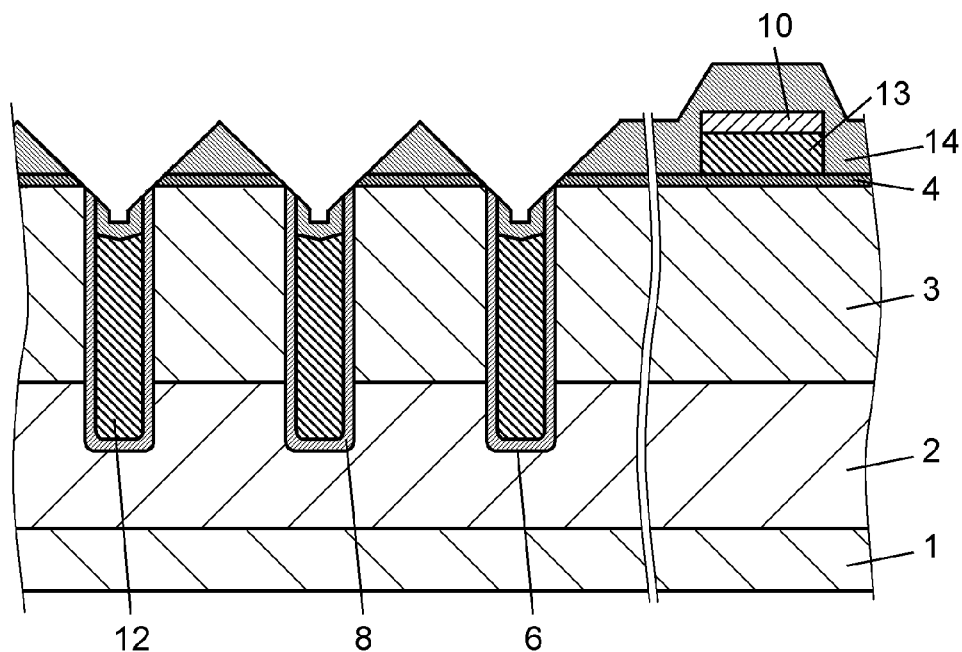
FIG. 23 is a cross-sectional view illustrating a modified example of a semiconductor device according to an exemplary embodiment of the present invention.

Subsequently, as shown in FIG. 21, resist pattern 11 covering the region in which the polysilicon interconnection such as a gate drawing interconnection should be formed is formed and cap insulating film 10 is etched using resist pattern 11 as a mask. Subsequently, resist pattern 11 is removed and then polysilicon film 9 is etched using patterned cap insulating film 10 as a mask. Accordingly, as shown in FIG. 22, polysilicon film 9 on silicon oxide film 4 and trench 6 is removed and gate electrode 12 is formed in trench 6. At the same time, polysilicon interconnection 13, on which cap insulating film 10 is formed, is formed in the transistor non-forming region. After polysilicon interconnection 13 is formed, first insulating film 14 is formed on the substrate as shown in FIG. 23.

Figure 24:
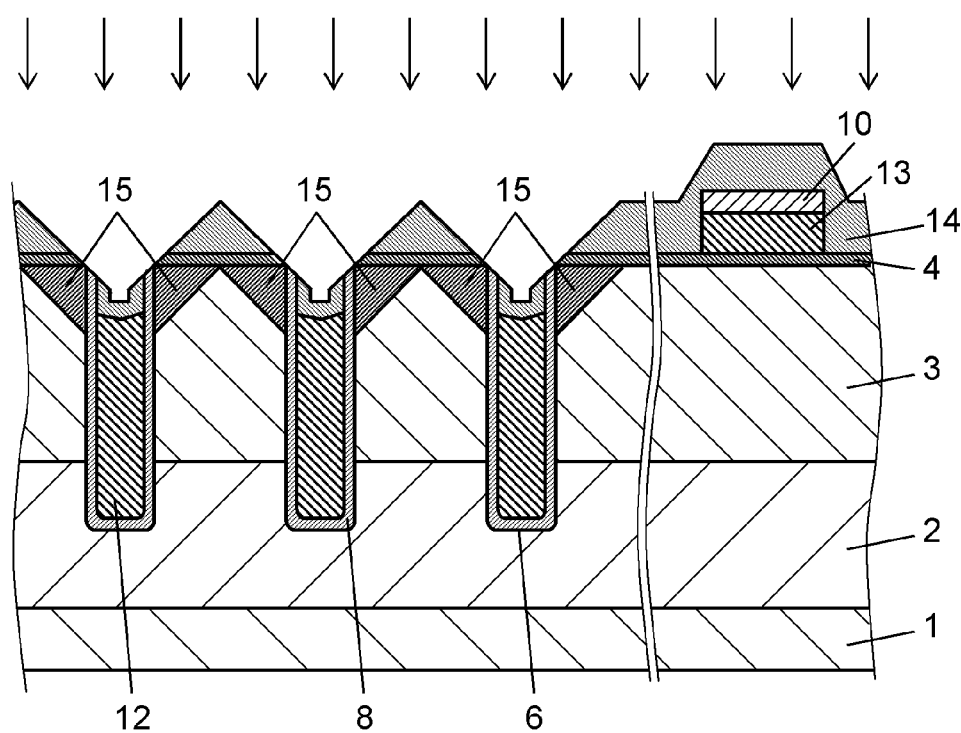
FIG. 24 is a cross-sectional view illustrating a modified example of a semiconductor device according to an exemplary embodiment of the present invention.
Figure 25:
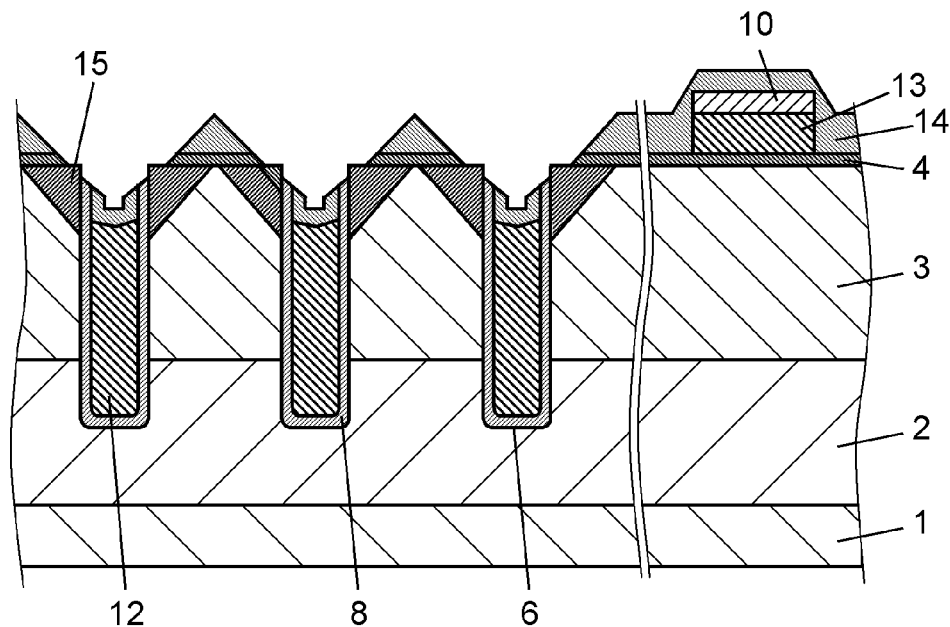
FIG. 25 is a cross-sectional view illustrating a modified example of a semiconductor device according to an exemplary embodiment of the present invention.
Figure 26:
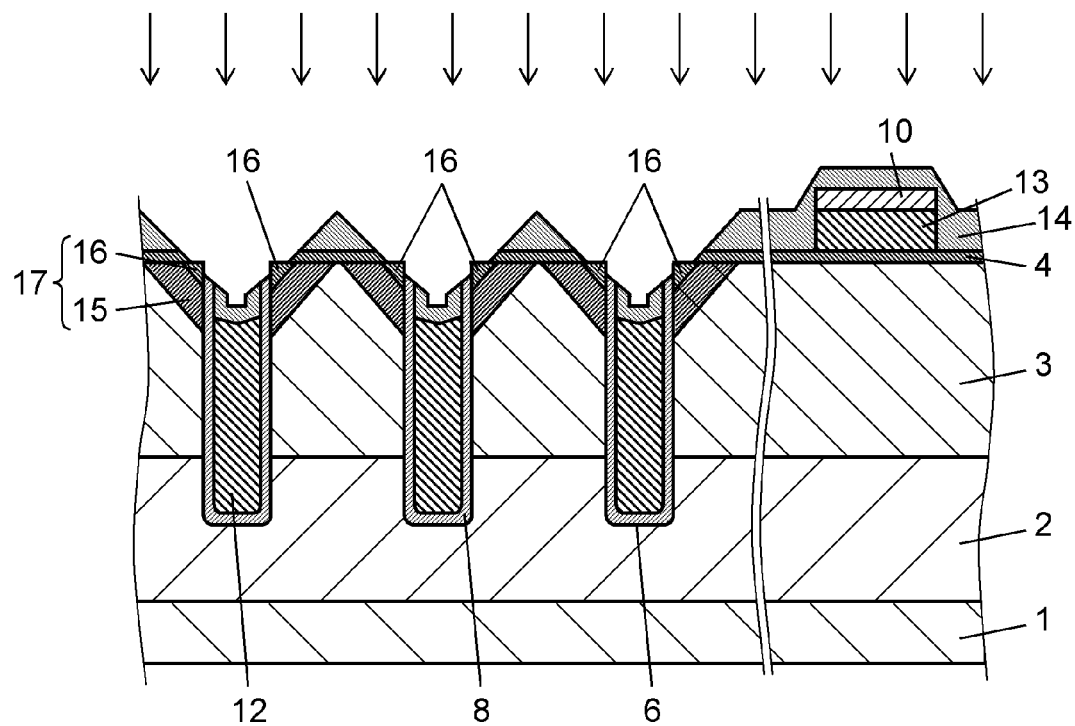
FIG. 26 is a cross-sectional view illustrating a modified example of a semiconductor device according to an exemplary embodiment of the present invention.

In this configuration, polysilicon interconnection 13 is covered with a thick stacked film including cap insulating film 10 and first insulating film 14. Accordingly, even when the implantation acceleration voltage is raised in the ion implantation (FIG. 24) for forming first source region 15 to be carried out thereafter, and the ion implantation (FIG. 26) for forming second source region 16 to be carried out after etching back (FIG. 25) first insulating film 14 and silicon oxide film 4, N-type impurities are not introduced into polysilicon interconnection 13. Therefore, it is possible to suppress occurrence of an operation difference or a characteristic difference in the semiconductor device with vertical gate. When polysilicon film 9 is a polysilicon film having conductivity by forming a non-doped polysilicon film and then performing N-type impurity ion implantation and annealing processes thereon, it may be possible to prevent the external diffusion of impurities from polysilicon film 9 at the time of annealing by forming cap insulating film 10. The thickness of cap insulating film 10 can be appropriately set within a range in which the above-mentioned advantages can be achieved.

Figure 27:
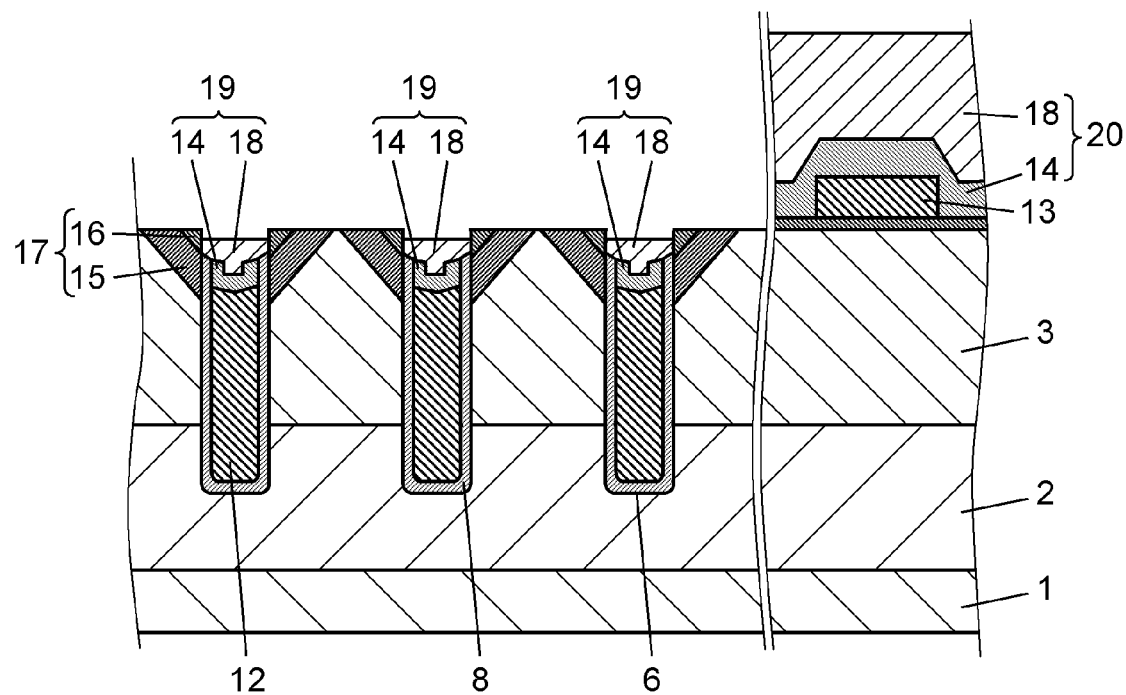
FIG. 27 is a cross-sectional view illustrating a modified example of a semiconductor device according to an exemplary embodiment of the present invention.

On the other hand, in the process (FIG. 16) of etching first insulating film 14, second insulating film 18, and silicon oxide film 4 in the above-mentioned embodiment, the stacked insulating film including first insulating film 14 and second insulating film 18 filled on gate electrode 12 may be etched in a state where the top surface thereof is substantially flush with the top (substrate surface) of trench 6. In this case, as shown in FIG. 27, the top surface of embedded insulating film 19 filling the top of gate electrode 12 in trench 6 is substantially flush with the top of trench 6.

Figure 28:
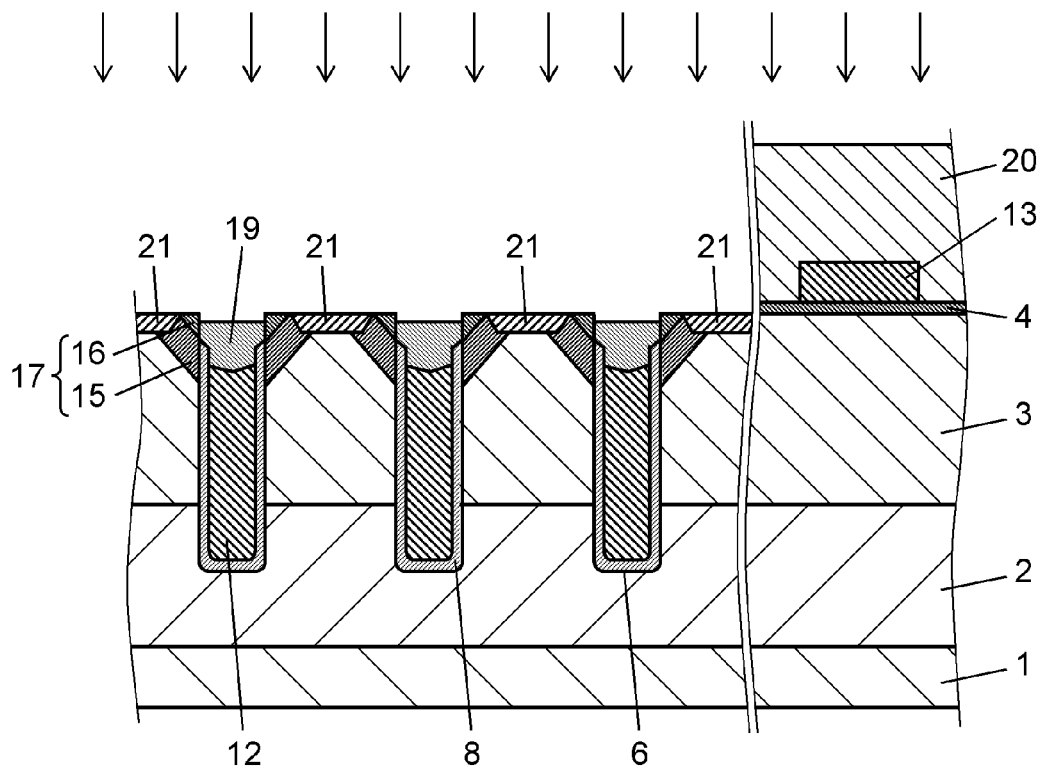
FIG. 28 is a cross-sectional view illustrating a modified example of a semiconductor device according to an exemplary embodiment of the present invention.

In this case, as shown in FIG. 28, since the side wall of trench 6 is not exposed in the process of forming body contact region 21, the introduction of P-type impurities from the side wall to source region 17 is suppressed. That is, it is possible to prevent an increase in source resistance.

Figure 29:
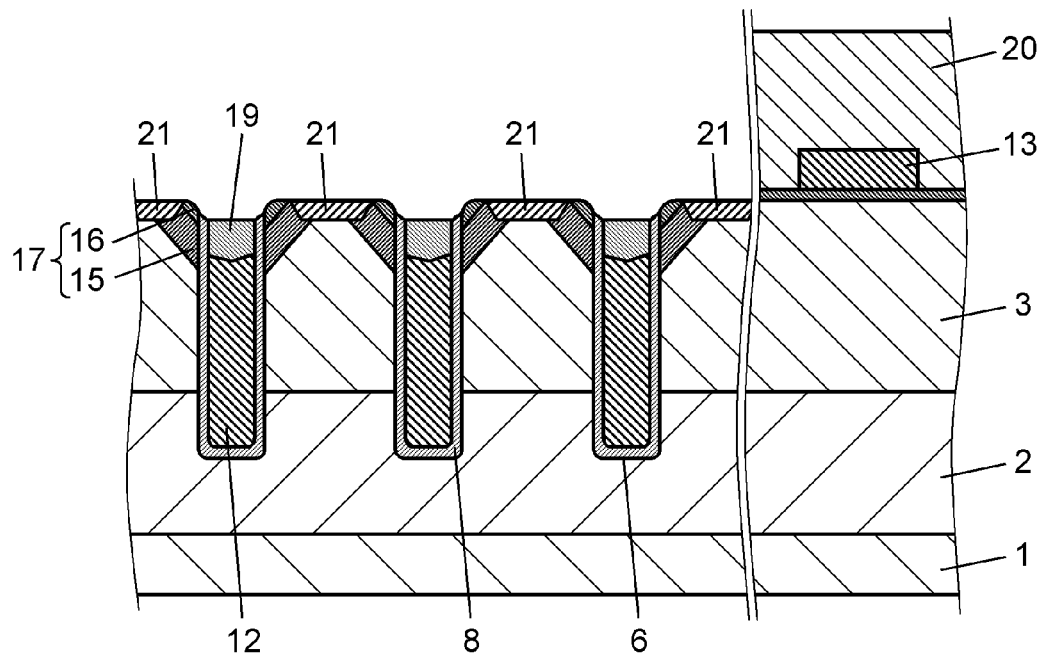
FIG. 29 is a cross-sectional view illustrating a modified example of a semiconductor device according to an exemplary embodiment of the present invention.

In this configuration, since source region 17 and barrier metal film 22 are in contact with only the top surface of source region 17, it is preferable that an entire-surface dry etching process be carried out after forming body contact region 21 and before forming barrier metal film 22. In the entire-surface etching process, as shown in FIG. 29, a part of embedded insulating film 19 is etched back to expose source region 17 constituting the side wall of trench 6. Accordingly, it is possible to increase the contact area between source region 17 and barrier metal film 22 and to suppress an increase in contact resistance to source region 17. The amount of embedded insulating film 19 etched can be set, for example, to a range of 50 nm to 300 nm which is smaller than the thickness of first insulating film 14. Although not particularly limited, the etching may be carried out in a state where a resist pattern is formed on interlayer insulating film 20, from the viewpoint of preventing a decrease in thickness of interlayer insulating film 20.

As shown in FIG. 29, the dry etching process for exposing first source region 15 from the side wall of trench 6 is preferably carried out under such a condition to process source region 17 at the top of the side wall of trench 6 in a curved shape. This curved surface can be implemented by employing an etching condition (for example, where the etching rate of embedded insulating film 19 is about twice to five times as high as the etching rate of silicon) that the etching rate of silicon (epitaxial silicon layer) is higher than the etching rate of embedded insulating film 19. Alternatively, at the final step of the entire-surface dry etching, inert gas such as Ar can be introduced to carry out a sputter-etching process. Accordingly, the concave portion formed just on embedded insulating film 19 can be easily embedded with metal film 23 or the like. The subsequent formation of the barrier metal film and the metal film is as described above. The curved-shape processing step at the top of the side wall of trench 6 may be applied to the etching process for forming embedded insulating film 19 shown in FIG. 16.

A semiconductor device according to a modified example of the exemplary embodiment of the present invention will be described below with reference to the accompanying drawings along with the manufacturing method thereof.

Figure 30:
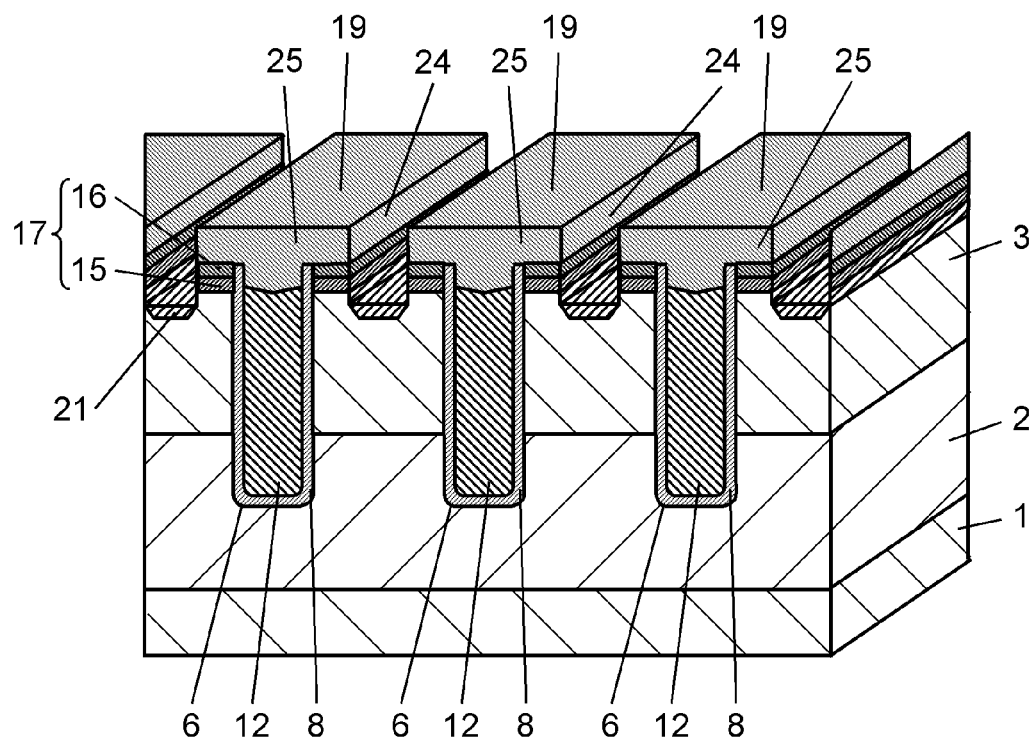
FIG. 30 is a diagram schematically illustrating the configuration of a modified example of a semiconductor device according to an exemplary embodiment of the present invention.
Figure 31:
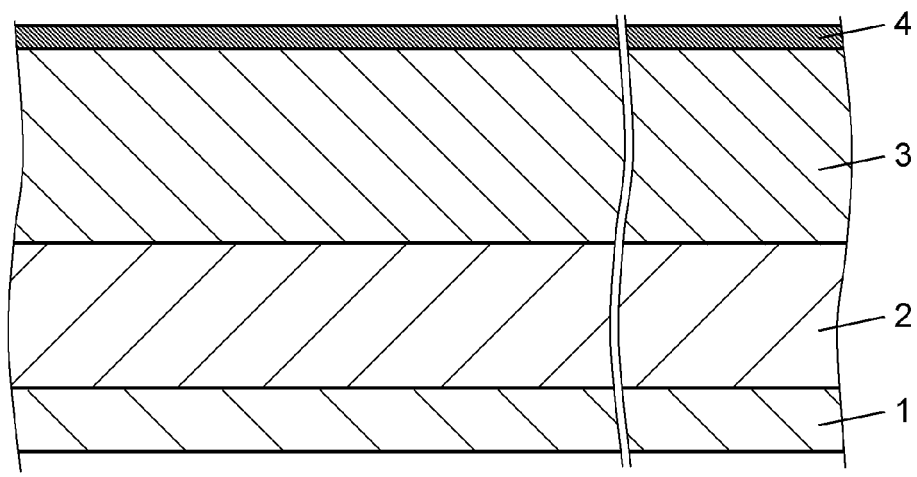
FIG. 31 is a cross-sectional view illustrating a process of manufacturing a modified example of a semiconductor device according to an exemplary embodiment of the present invention.
Figure 32:
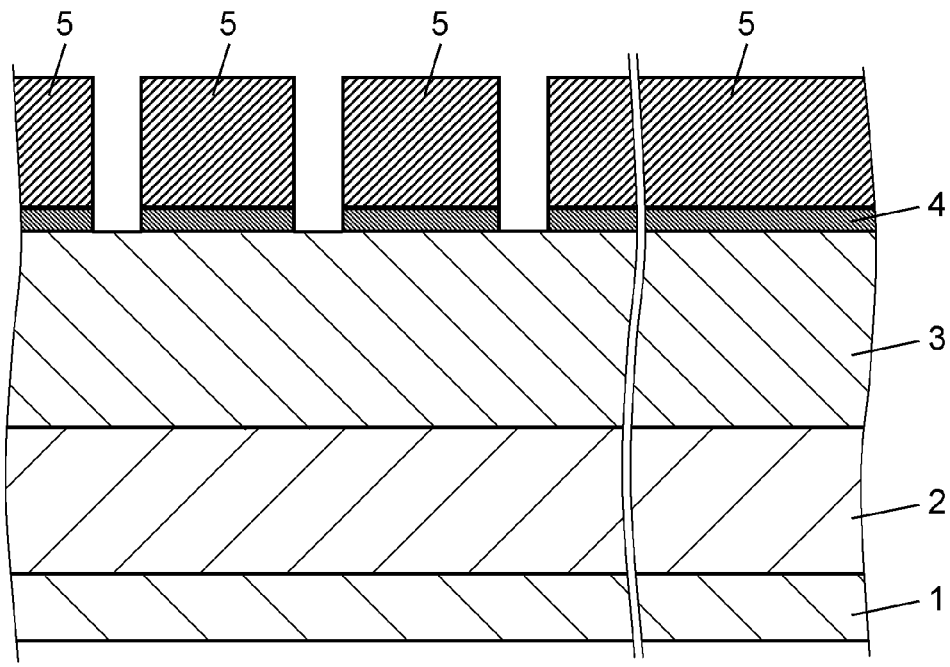
FIG. 32 is a cross-sectional view illustrating a process of manufacturing a modified example of a semiconductor device according to an exemplary embodiment of the present invention.
Figure 33:
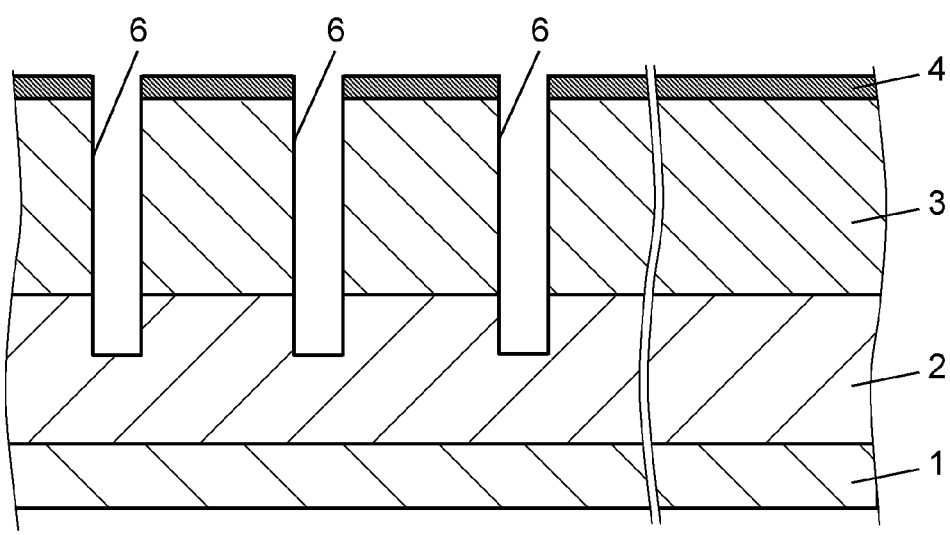
FIG. 33 is a cross-sectional view illustrating a process of manufacturing a modified example of a semiconductor device according to an exemplary embodiment of the present invention.
Figure 34:
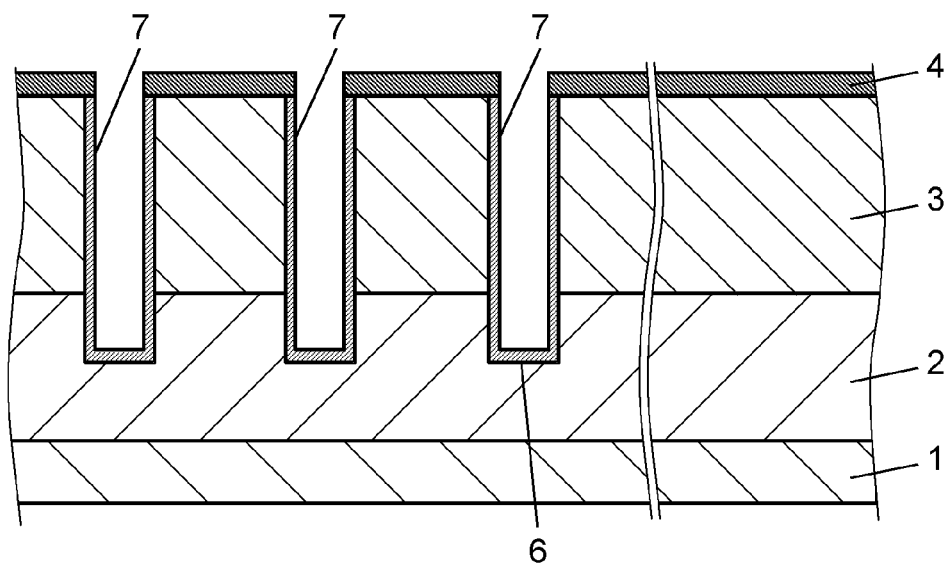
FIG. 34 is a cross-sectional view illustrating a process of manufacturing a modified example of a semiconductor device according to an exemplary embodiment of the present invention.
Figure 35:
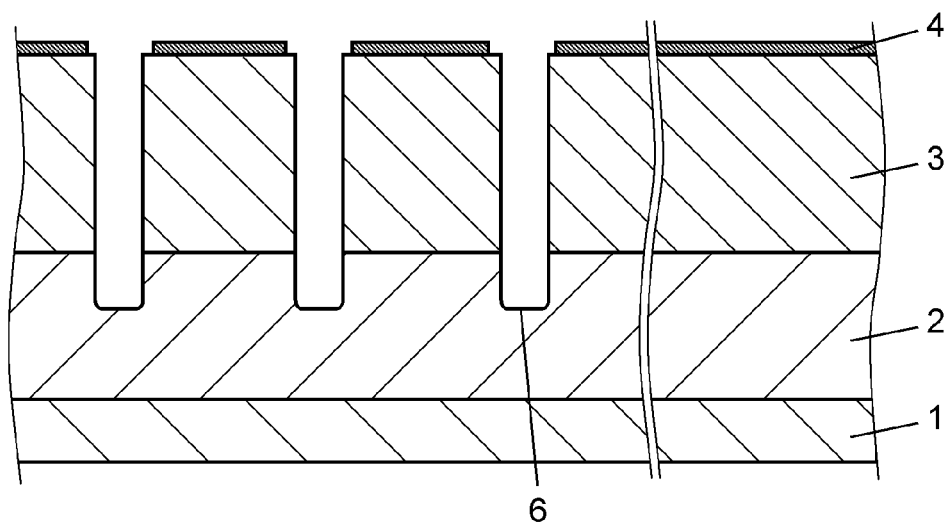
FIG. 35 is a cross-sectional view illustrating a process of manufacturing a modified example of a semiconductor device according to an exemplary embodiment of the present invention.
Figure 36:
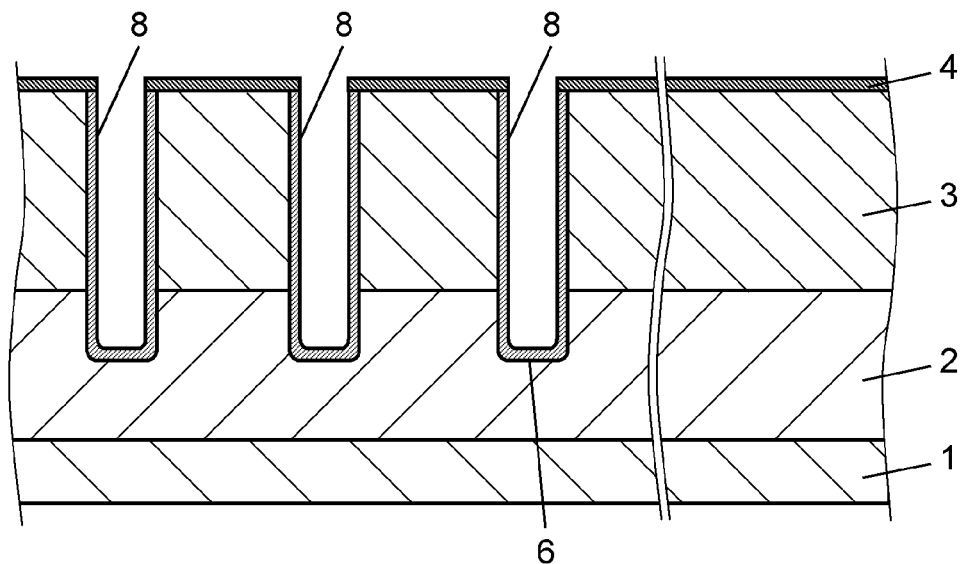
FIG. 36 is a cross-sectional view illustrating a process of manufacturing a modified example of a semiconductor device according to an exemplary embodiment of the present invention.

FIG. 30 is a schematic diagram illustrating a semiconductor device according to a modified example of the exemplary embodiment of the present invention. In FIG. 30, the source electrode and the structure above the source electrode are not shown. FIG. 30 is only a schematic diagram and thus the dimensional ratio of constituent parts does not show the actual dimensional ratio. Here, differences from FIG. 1 will be mainly described.

First, in FIG. 1, the depth of source region 17 becomes smaller as it gets away from the trench. On the other hand, as shown in FIG. 30, the depth of source region 17 may not substantially vary as it gets away from the trench.

In FIG. 1, embedded insulating film 19 embeds a part of the concave portion formed on the top of trench 6. On the other hand, as shown in FIG. 30, embedded insulating film 19 may fully embed the concave portion formed on the top of trench 6 and may embed rectangular region 25 to be described later to fully cover the top surface of source region 17.

In FIG. 1, body contact region 21 is disposed on the top surface of body region 3 so as to be adjacent to source region 17. On the other hand, as shown in FIG. 30, body contact region 21 may be disposed on the bottom of second trench 24 formed on the top surface of body region 3. At this time, body contact region 21 may be disposed at a position lower than the bottom of source region 17. Body contact region 21 may be disposed at a position lower than the top surface of gate electrode 12.

In FIG. 1, it is assumed that trench 6 has a width of about 0.18 μm and a depth of about 0.8 μm and the trenches are arranged with a pitch of 0.6 μm. On the other hand, in FIG. 30, it is assumed that trench 6 has a width of about 0.15 μm to 0.5 μm and the trenches are arranged with a pitch of 0.4 μm to 1.5 μm. That is, the modified example has a configuration more suitable for a finer semiconductor device.

A method of manufacturing a semiconductor device according to the modified example of the exemplary embodiment of the present invention will be described below with reference to FIGS. 31 to 58. In FIGS. 31 to 58, a transistor forming region is shown on the left side and a peripheral region (transistor non-forming region) of the transistor forming region in which interconnections such as a gate drawing interconnection are formed is shown on the right side. Similarly to FIG. 30, FIGS. 31 to 58 are only schematic diagrams and the dimensional ratio of constituent parts does not show the actual dimensional ratio. Hereinafter, if a thin film is formed on the top surface, it is appropriately expressed that a film is formed on a substrate. FIGS. 31 to 40 are the same as FIGS. 2 to 11 and thus description thereof will not be repeated. The manufacturing method of FIG. 41 and the drawings subsequent thereto will be described below in detail. In FIG. 11, the thickness-increasing portion of first insulating film 14 has a forward tapered shape with a slope of which the angle with respect to the substrate surface is in a range of 30° to 60°. Here, when the angle is smaller than 30°, the thickness of the central portion of the insulating film in the region interposed between trench 6 and adjacent trench 6 decreases and it is thus difficult to achieve the function as a hard mask of an etching process for forming rectangular region 25. When the angle is larger than 60°, the thickness of the insulating film deposited on the side wall of the concave portion on gate electrode 12 increases and it is thus difficult to appropriately shape the substrate surface to be exposed in an isotropic etching process which is carried out subsequently.

Figure 40:
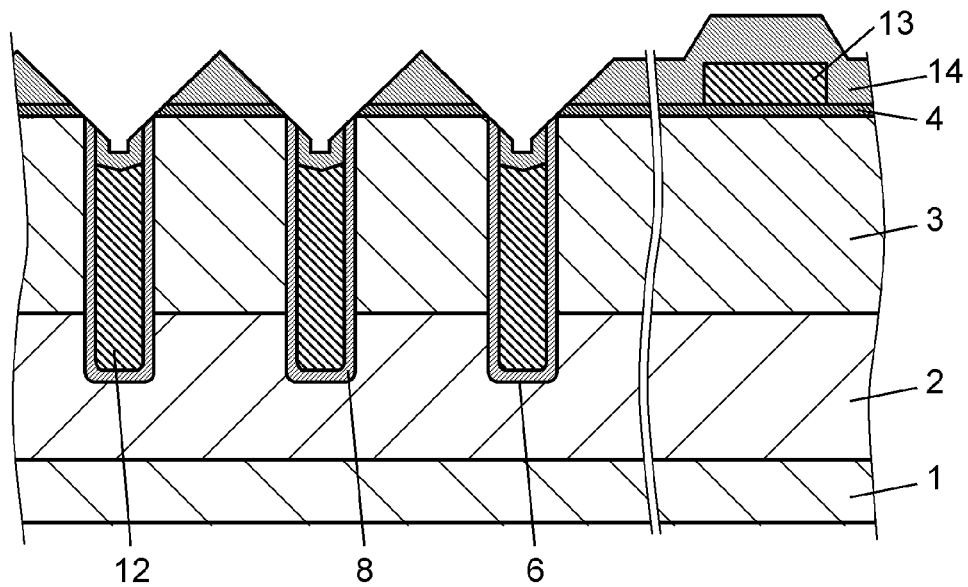
FIG. 40 is a cross-sectional view illustrating a process of manufacturing a modified example of a semiconductor device according to an exemplary embodiment of the present invention.
Figure 41:
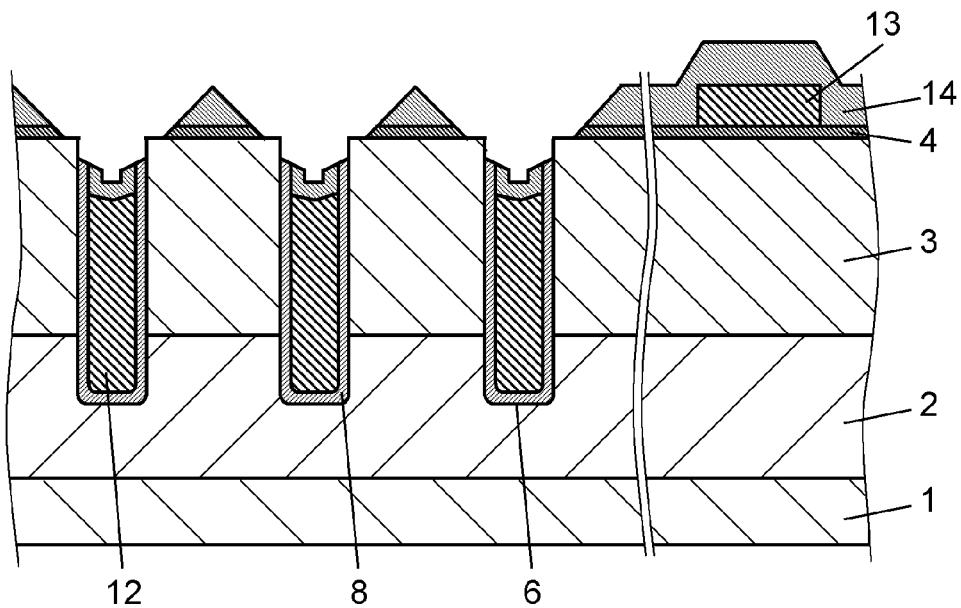
FIG. 41 is a cross-sectional view illustrating a process of manufacturing a modified example of a semiconductor device according to an exemplary embodiment of the present invention.

First, after FIG. 40, as shown in FIG. 41, a part of gate insulating film 8, silicon oxide film 4, and first insulating film 14 disposed on the upper side wall of trench 6 are isotropically etched to expose a part of body region 3.

Figure 42:
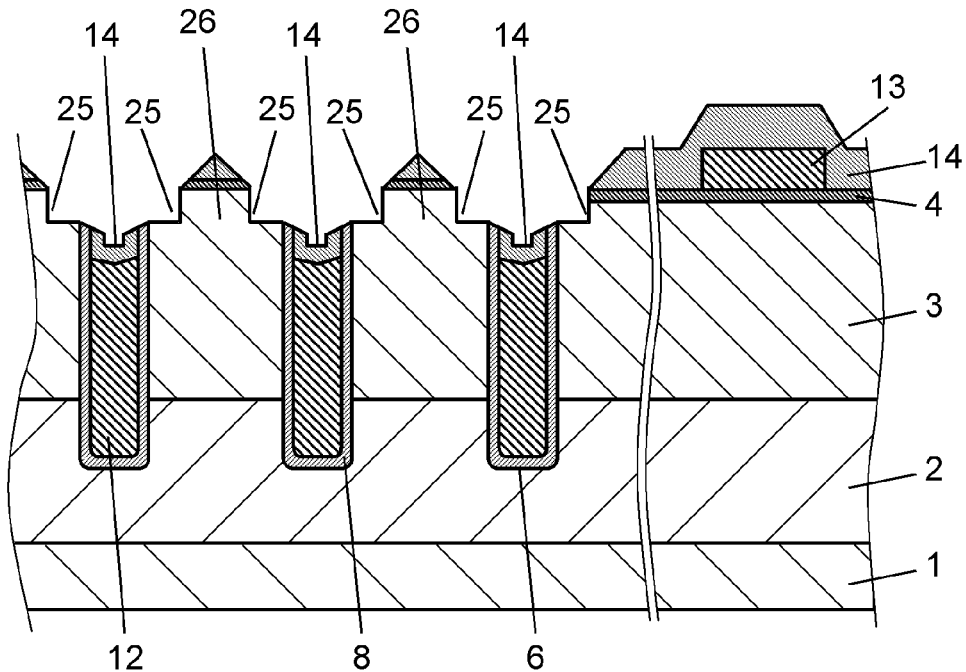
FIG. 42 is a cross-sectional view illustrating a process of manufacturing a modified example of a semiconductor device according to an exemplary embodiment of the present invention.

Thereafter, as shown in FIG. 42, the exposed part of body region 3 is removed by etching to form rectangular region 25 and silicon mesa region 26 at the same time. At this time, the bottom of rectangular region 25 is formed at a height equal to or smaller than that of the top surface of gate electrode 12.

Figure 43:
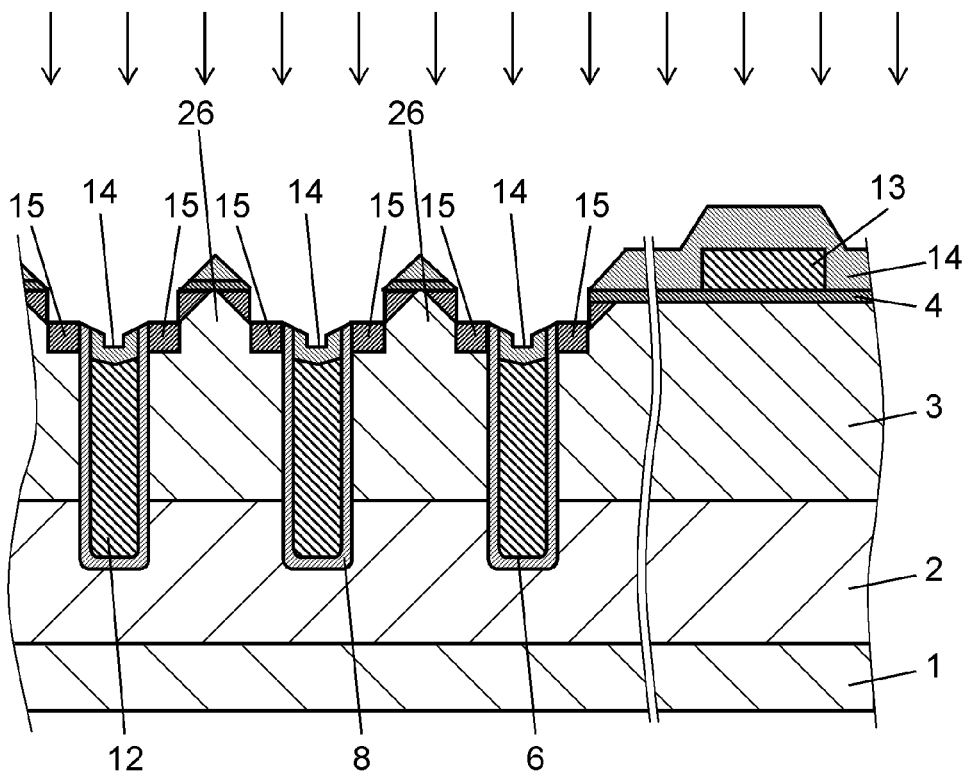
FIG. 43 is a cross-sectional view illustrating a process of manufacturing a modified example of a semiconductor device according to an exemplary embodiment of the present invention.

Then, as shown in FIG. 43, by introducing phosphorous as N-type impurities into the bottom surface of rectangular region 25 using first insulating film 14 on gate insulating film 8 and silicon oxide film 4 and first insulating film 14 on silicon mesa region 26 as a mask, first source region 15 is formed in body region 3. The impurity introduction can be carried out by ion implantation. At this time, the acceleration voltage of the ion implantation preferably employs the acceleration voltage with which impurities are introduced into the region adjacent to the top of gate electrode 12. At this time, source region 15 can be formed under the ion implantation condition of, for example, implantation energy of 40 KeV and an implantation dose of $4.0 \times 10^{15}$ cm$^{-2}$.

Figure 44:
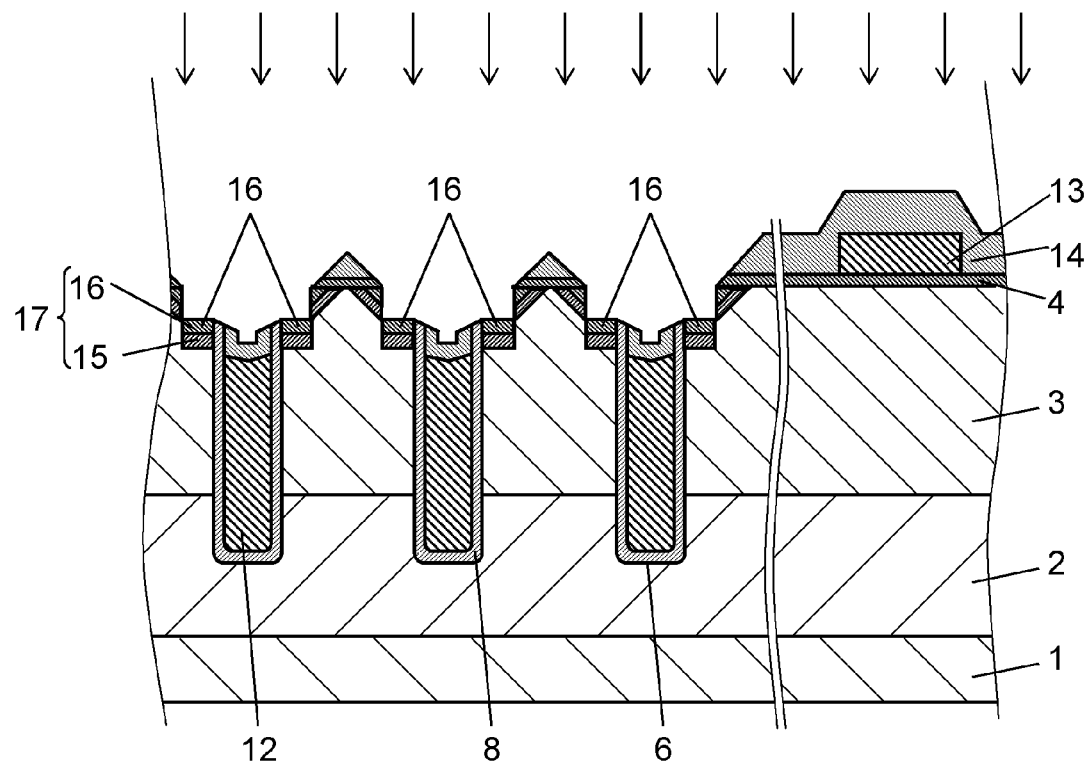
FIG. 44 is a cross-sectional view illustrating a process of manufacturing a modified example of a semiconductor device according to an exemplary embodiment of the present invention.

Subsequently, as shown in FIG. 44, second source region 16 is formed by carrying out ion implantation using arsenic as N-type impurities. At this time, by setting the implantation energy such that second source region 16 is shallower than the first source region, the impurity region of second source region 16 formed in body region 3 through the ion implantation is included in the impurity region formed through the ion implantation of phosphorous ions. That is, the N-type impurity concentration of the substrate surface can be raised by forming second source region 16 through the use of the ion implantation of arsenic. At this time, source region 16 can be formed under the ion implantation condition of, for example, implantation energy of 30 KeV and an implantation dose of $4.0 \times 10^{15}$ cm$^{-2}$. In this way, source region 17 including first source region 15 and second source region 16 is formed.

In this ion implantation, N-type impurities constituting source region 17 are introduced into first insulating film 14 formed on gate electrode 12 in trench 6 and silicon oxide film 4 and first insulating film 14 formed on silicon mesa region 26.

Figure 45:
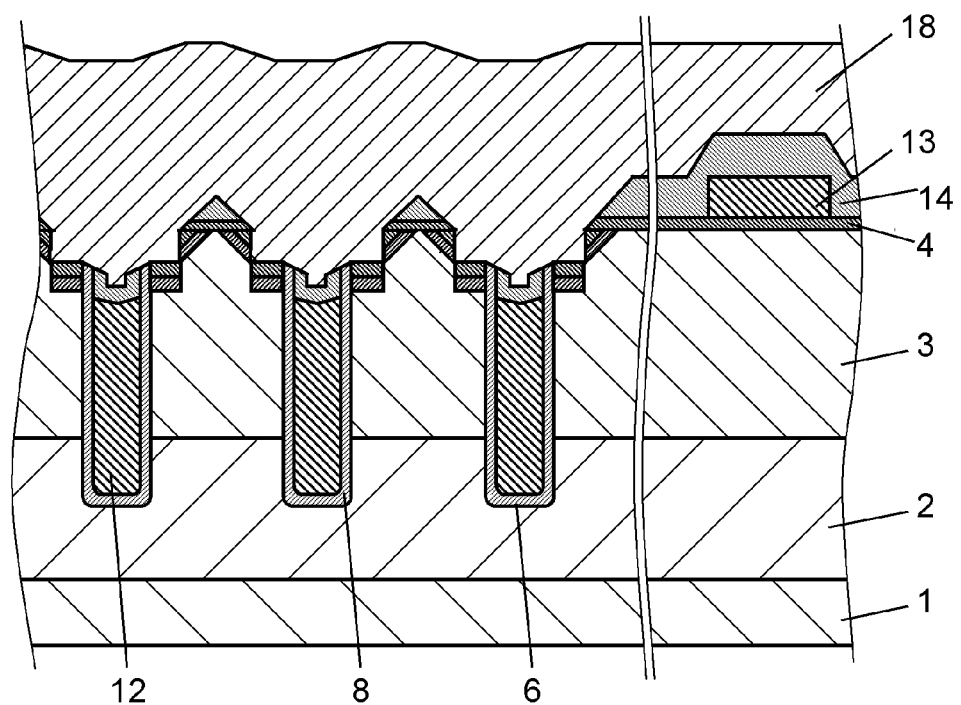
FIG. 45 is a cross-sectional view illustrating a process of manufacturing a modified example of a semiconductor device according to an exemplary embodiment of the present invention.

As shown in FIG. 45, second insulating film 18 serving as a planarization film reducing unevenness on the substrate is deposited on the substrate. Although not particularly limited, a silicon oxide film with a thickness of about 500 nm to 1500 nm is deposited as second insulating film 18 in this exemplary embodiment.

Figure 46:
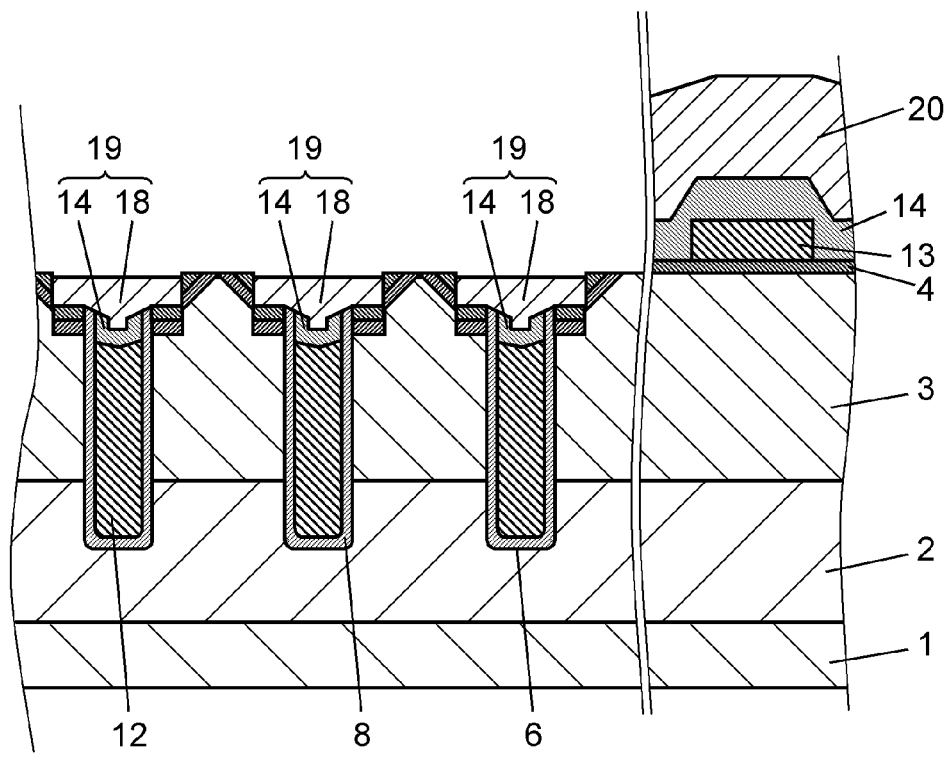
FIG. 46 is a cross-sectional view illustrating a process of manufacturing a modified example of a semiconductor device according to an exemplary embodiment of the present invention.

As shown in FIG. 46, second insulating film 18, first insulating film 14, and silicon oxide film 4 on body region 3 and source region 17 are removed by a dry etching process. This etching is preferably carried out in a state where an etching mask including a resist pattern is disposed on second insulating film 18 covering the polysilicon interconnection part such as a transistor non-forming region. In the etching, it is preferable that the stacked insulating film including first insulating film 14 and second insulating film 18 filled on gate electrode 12 be etched in a state where the stacked insulating film is located lower than the top surface of silicon mesa region 26 to be embedded insulating film 19 filling the top of gate electrode 12 and rectangular region 25 in trench 6 and the stacked insulating film covered with the resist pattern remain as interlayer insulating film 20 on the substrate. The stacked insulating film on the semiconductor substrate on which the resist pattern is not disposed is removed to expose the substrate surface. The resist pattern can be disposed to cover the region in which interlayer insulating film 20 should be formed, without being limited to the polysilicon interconnection part on the substrate.

As described above, in this modified example, source region 17 is formed by ion implantation through silicon oxide film 4 and first insulating film 14. Accordingly, silicon oxide film 4 of the stacked insulating film and the silicon oxide film as first insulating film 14 include N-type impurities as shown in FIG. 44, and the silicon insulating film as second insulating film 18 does not include N-type impurities as shown in FIG. 45. As shown in FIG. 45, the thickness of second insulating film 18 of the stacked insulating film formed on silicon mesa region 26 between trenches 6 is smaller than the thickness of second insulating film 18 of the stacked insulating film formed on gate electrode 12 and rectangular region 25. Accordingly, when the dry etching condition that the etching rate of silicon oxide film 4 and first insulating film 14 including N-type impurities is higher than the etching rate of second insulating film 18 not including N-type impurities is applied to the dry etching process on the stacked insulating film, the etching rate of the stacked insulating film formed on the silicon mesa region between trenches 6 can be made to be higher than the etching rate of the stacked insulating film formed on gate electrode 12 and rectangular region 25. By employing this dry etching condition, the thickness of embedded insulating film 19 can be made to be larger than that in the dry etching condition that the stacked insulating film is etched at the same etching rate. That is, since a thick insulating film can be interposed between the source electrode to be formed on embedded insulating film 19 later and gate electrode 12, it is possible to suppress a decrease in withstanding voltage due to the decrease in thickness of embedded insulating film 19. In this modified example, since first insulating film 14 and second insulating film 18 are formed of a silicon oxide film and phosphorous and arsenic ions are implanted into first insulating film 14, the etching rate of first insulating film 14 naturally becomes higher than the etching rate of second insulating film 18 in the dry etching process on the silicon oxide film. For example, when fluorine-based gas which is generally used to etch a silicon oxide film is used, the etching rate of first insulating film 14 is higher by 5% than the etching rate of second insulating film 18. In the wet etching process using hydrofluoric acid, the etching rate of first insulating film 14 is twice as high as the etching rate of second insulating film 18.

After depositing second insulating film 18 and before etching the stacked insulating film, the surface of second insulating film 18 may be planarized through the use of a CMP (Chemical Mechanical Polishing) process. Accordingly, the thickness of second insulating film 18 of the stacked insulating film formed on the silicon mesa region between adjacent trenches 6 can be made to be smaller than the thickness of second insulating film 18 of the stacked insulating film formed on gate electrode 12 and rectangular region 25. As a result, it is possible to more easily form embedded insulating film 19 in each trench 6. Since the thickness of the stacked insulating film to be etched after the CMP process is reduced by applying the CMP process, embedded insulating film 19 can be formed with a reduced thickness difference.

Figure 47:
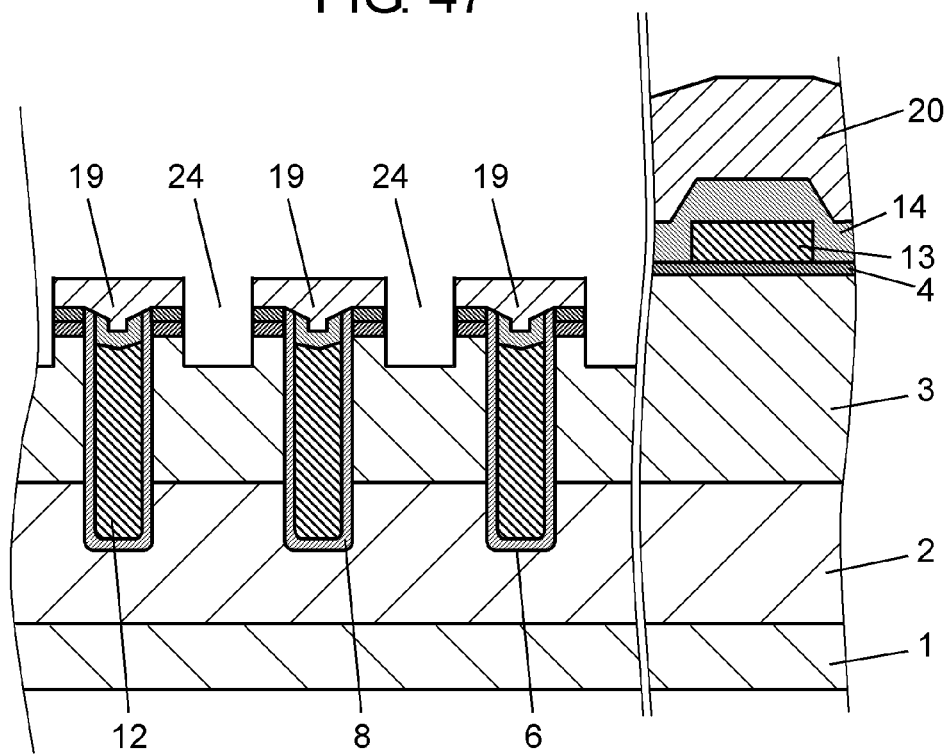
FIG. 47 is a cross-sectional view illustrating a process of manufacturing a modified example of a semiconductor device according to an exemplary embodiment of the present invention.

Then, as shown in FIG. 47, the substrate surface from which silicon mesa region 26 is exposed is etched using embedded insulating film 19 as a mask to form second trench 24. At this time, at least embedded insulating film 19 and the source region are exposed from the side wall of second trench 24 and body region 3 is exposed from the bottom surface of second trench 24.

Figure 48:
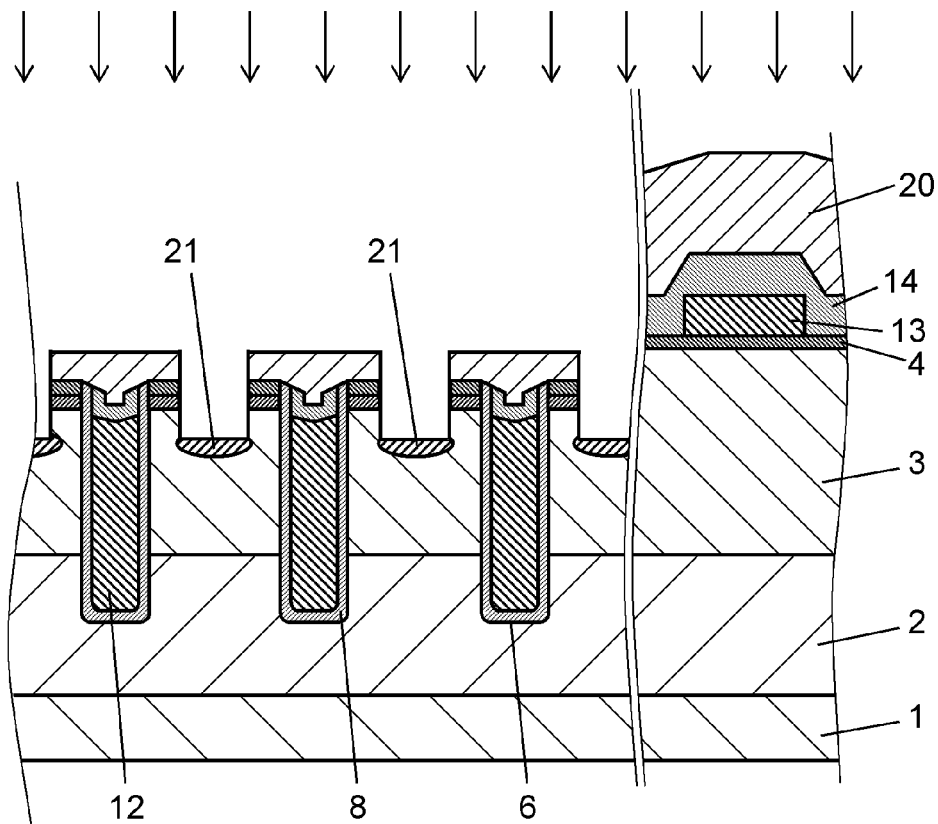
FIG. 48 is a cross-sectional view illustrating a process of manufacturing a modified example of a semiconductor device according to an exemplary embodiment of the present invention.

Subsequently, as shown in FIG. 48, by introducing P-type impurities, body contact region 21 is formed. In this ion implantation, it is preferable that the impurities be incident substantially perpendicularly on the substrate. The ion implantation is carried out with an implantation dose by which the impurity polarity of source region 17 is not inverted. Accordingly, P-type body contact region 21 is formed on body region 3 in a self-alignment manner. In the ion implantation, P-type impurities constituting body contact region 21 are introduced into at least the top of embedded insulating film 19 formed on gate electrode 12 and rectangular region 25 in trench 6.

For example, when source region 17 is formed through the ion implantation under the above-mentioned ion implantation condition and boron is used as the second conductivity type of impurities, body contact region 21 can be formed with implantation energy of 5 KeV and an implantation dose of $1.0 \times 10^{15}$ cm$^{-2}$.

When the formation of body contact region 21 is completed in this way, a conductive film (source electrode) electrically connecting source region 17 and body contact region 21 is formed. Although not particularly limited, the conductive film is formed of a stacked film of barrier metal film 22 including a titanium film (Ti) and a titanium nitride film (TiN) and metal film 23 including a tungsten film and an aluminum film in this modified example.

Figure 49:
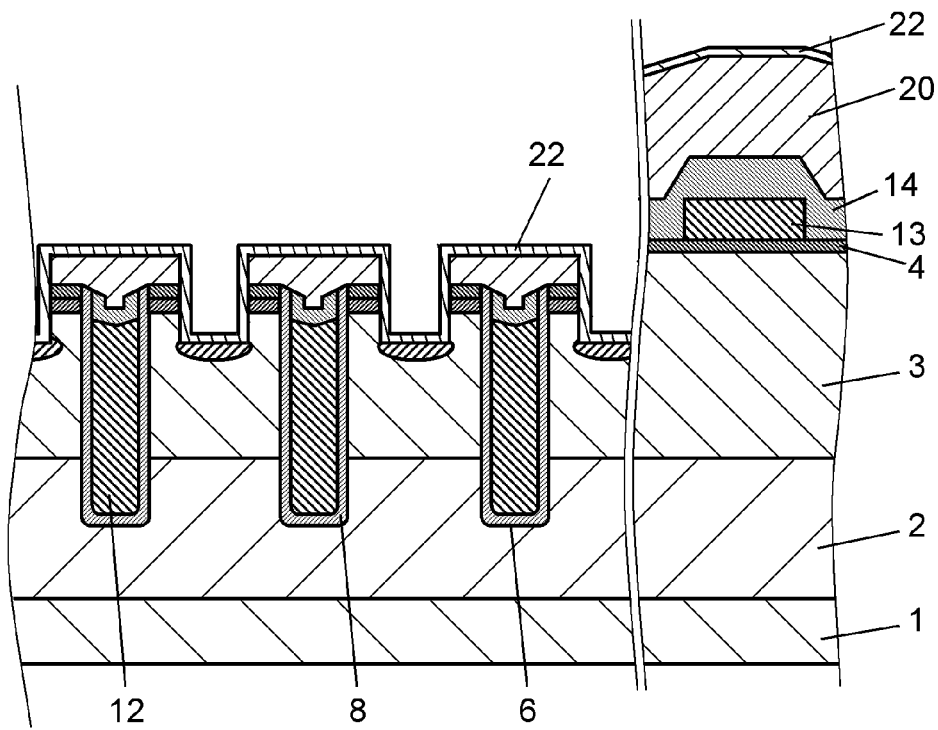
FIG. 49 is a cross-sectional view illustrating a process of manufacturing a modified example of a semiconductor device according to an exemplary embodiment of the present invention.
Figure 50:
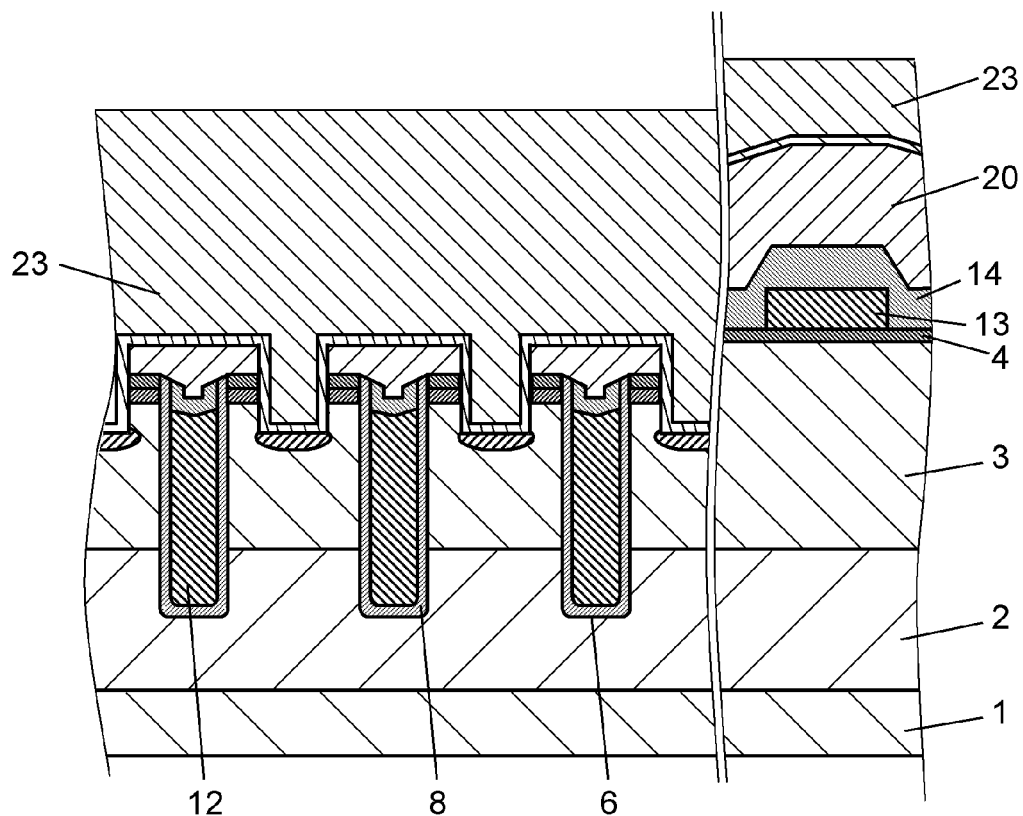
FIG. 50 is a cross-sectional view illustrating a process of manufacturing a modified example of a semiconductor device according to an exemplary embodiment of the present invention.

First, as shown in FIG. 49, barrier metal film 22 with a thickness of about 10 nm to 100 nm is formed on the substrate having body contact region 21 formed thereon through the use of a CVD method or the like. Then, as shown in FIG. 50, metal film 23 including a tungsten film with a thickness of about 50 nm to 400 nm and an aluminum film with a thickness of about 1000 nm to 5000 nm is formed on barrier metal film 22 through the use of a CVD method or the like. By applying a lithography technique and an etching technique to barrier metal film 22 and metal film 23, a conductor pattern of a desired shape is formed and a vertical-gate transistor is completed.

As described above, the semiconductor device with vertical gate according to this modified example has a structure in which source region 17, second trench 23, and body contact region 21 can be formed without using a lithography technique. Accordingly, it is not necessary to secure a margin for mask superposition shift and it is possible to further reduce the gate electrode pitch, compared with the conventional art. Body contact region 21 is formed in the same plane as source region 17 or below the source region and is connected to the source electrode through the conductor film at low resistance. As a result, it is possible to implement a semiconductor device with vertical gate with smaller on-resistance in which the operation of a parasitic bipolar transistor is suppressed due to lower contact resistance between the body region and the source electrode. In the semiconductor device with vertical gate, since the impurity concentration of source region 17 formed below the silicon surface of rectangular region 25 can be made to have a steep impurity concentration gradient or the impurity concentration gradient can be easily controlled, it is possible to easily control the channel length of a vertical MOS transistor along trench 6 and thus to shrink the vertical transistor in the vertical direction.

Figure 37:
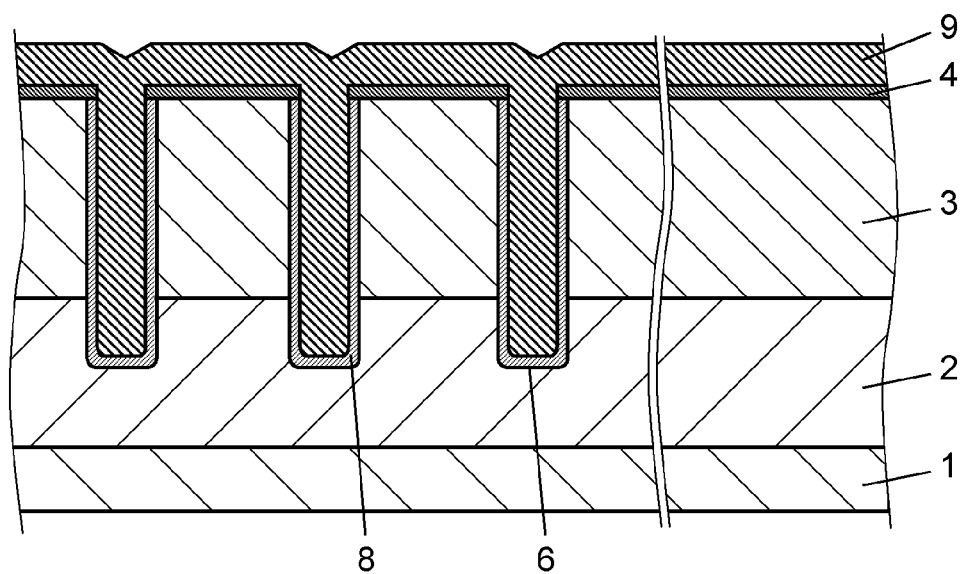
FIG. 37 is a cross-sectional view illustrating a process of manufacturing a modified example of a semiconductor device according to an exemplary embodiment of the present invention.
Figure 38:
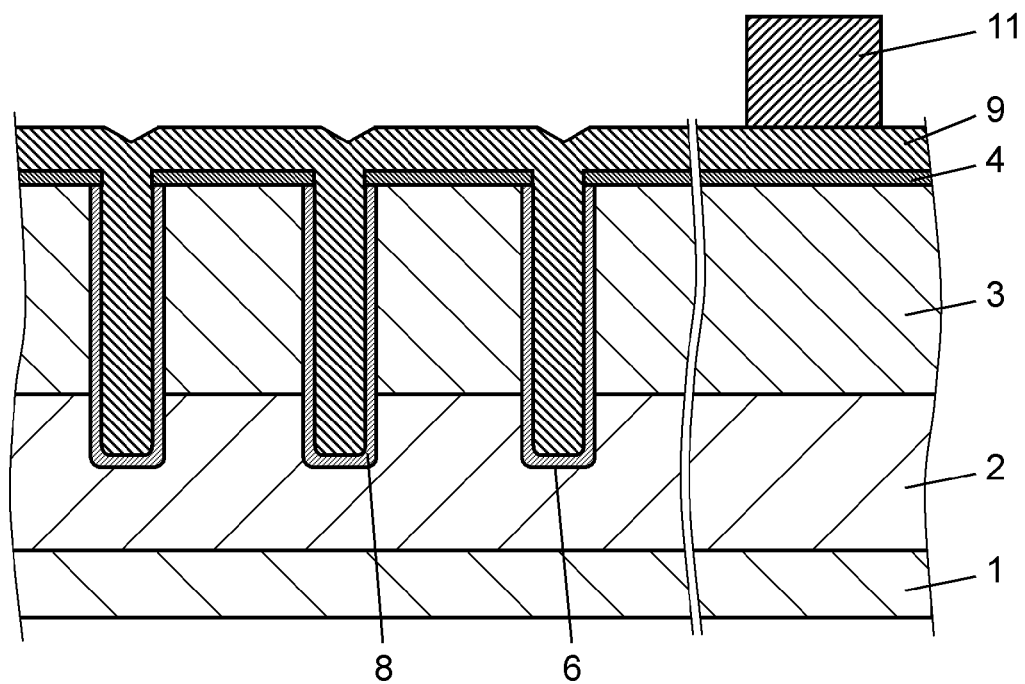
FIG. 38 is a cross-sectional view illustrating a process of manufacturing a modified example of a semiconductor device according to an exemplary embodiment of the present invention.
Figure 39:
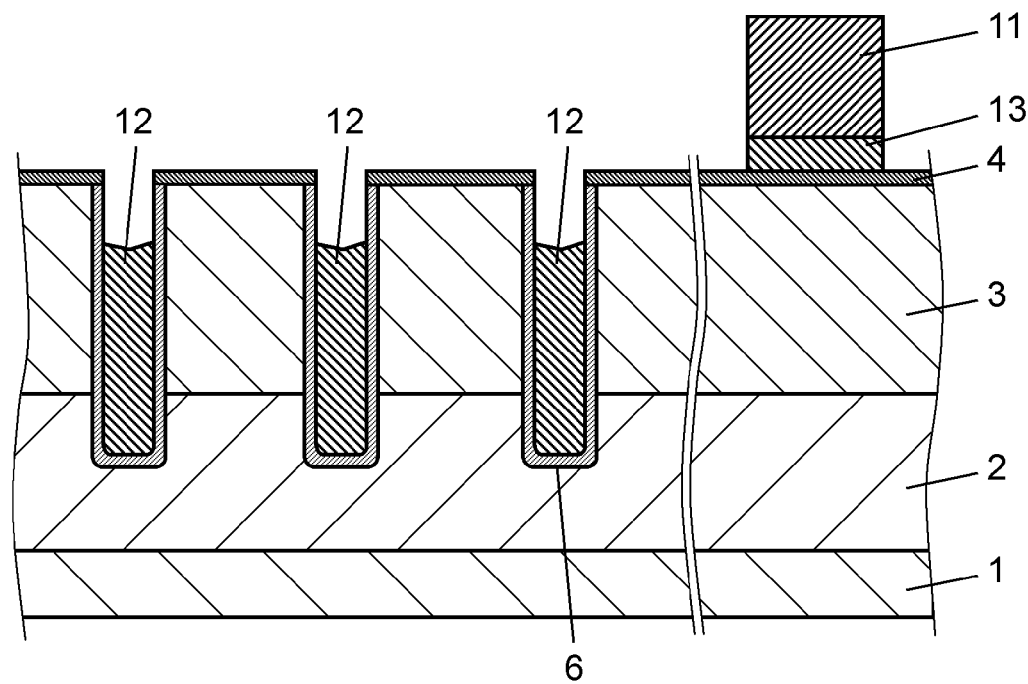
FIG. 39 is a cross-sectional view illustrating a process of manufacturing a modified example of a semiconductor device according to an exemplary embodiment of the present invention.
Figure 51:
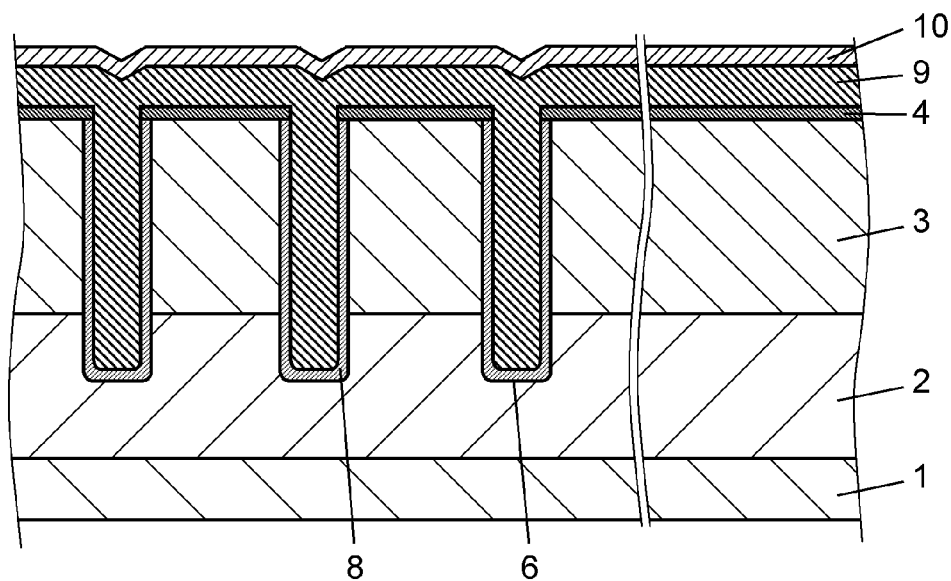
FIG. 51 is a cross-sectional view illustrating a modified example of a semiconductor device according to an exemplary embodiment of the present invention.
Figure 52:
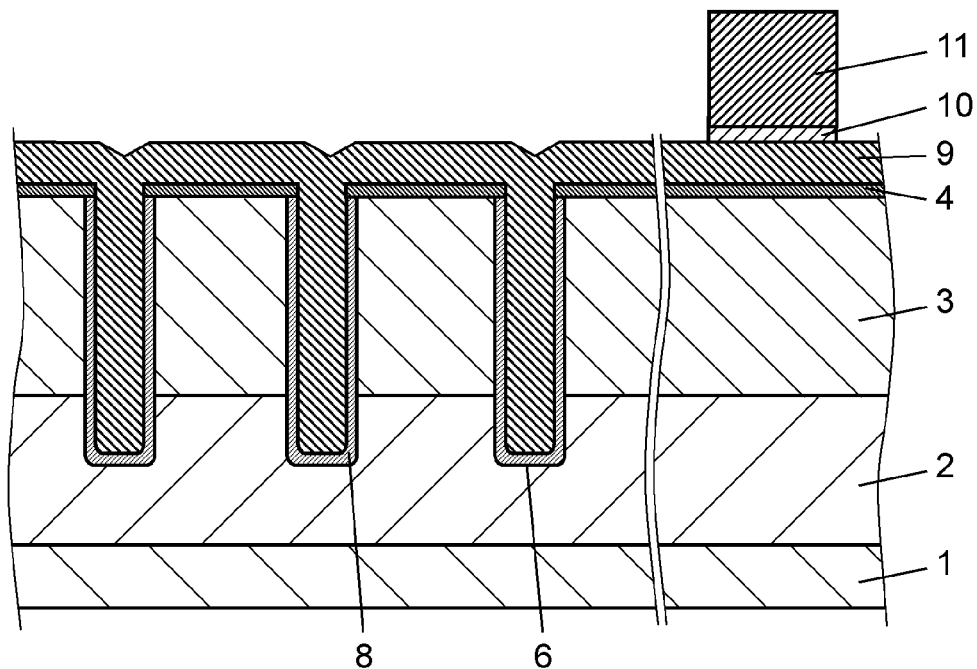
FIG. 52 is a cross-sectional view illustrating a modified example of a semiconductor device according to an exemplary embodiment of the present invention.
Figure 53:
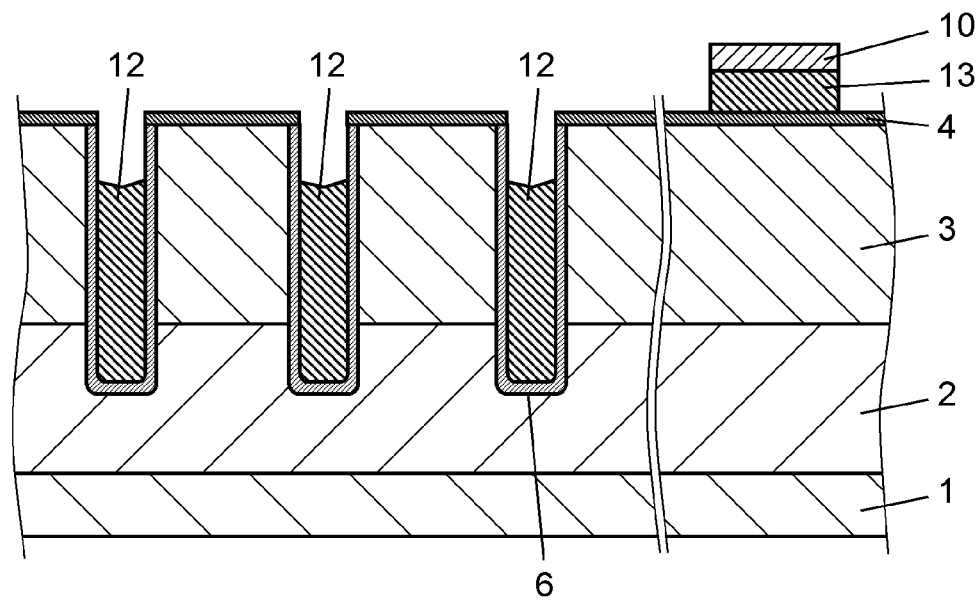
FIG. 53 is a cross-sectional view illustrating a modified example of a semiconductor device according to an exemplary embodiment of the present invention.
Figure 54:
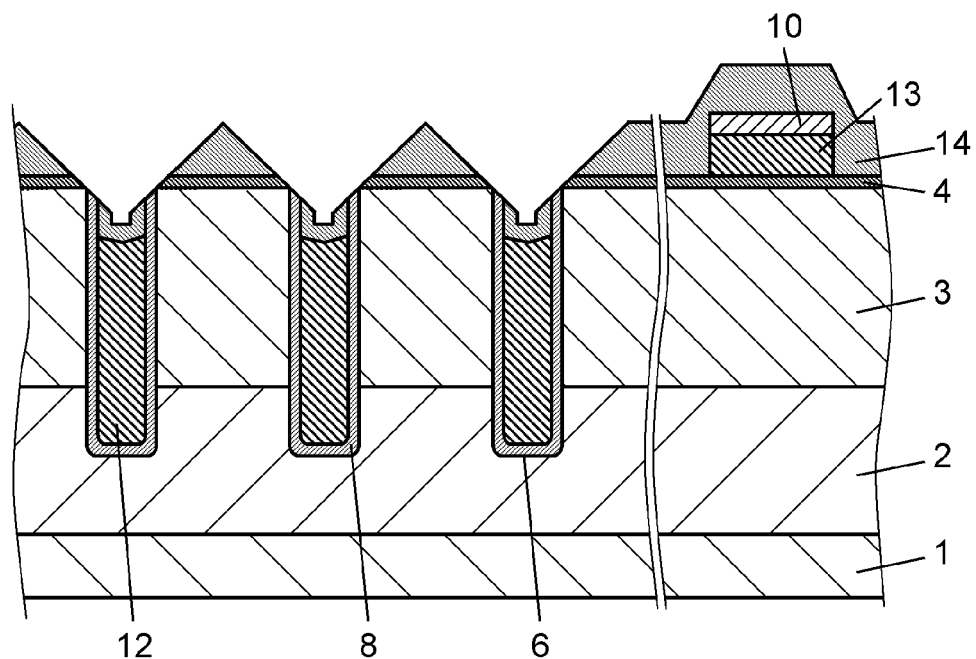
FIG. 54 is a cross-sectional view illustrating a modified example of a semiconductor device according to an exemplary embodiment of the present invention.
Figure 55:
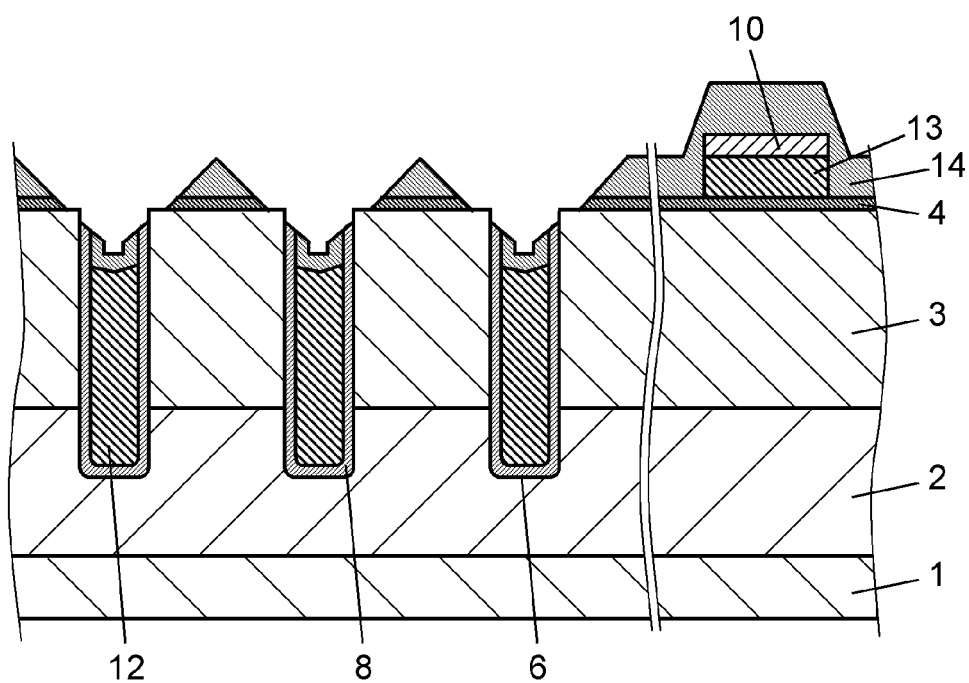
FIG. 55 is a cross-sectional view illustrating a modified example of a semiconductor device according to an exemplary embodiment of the present invention.
Figure 56:
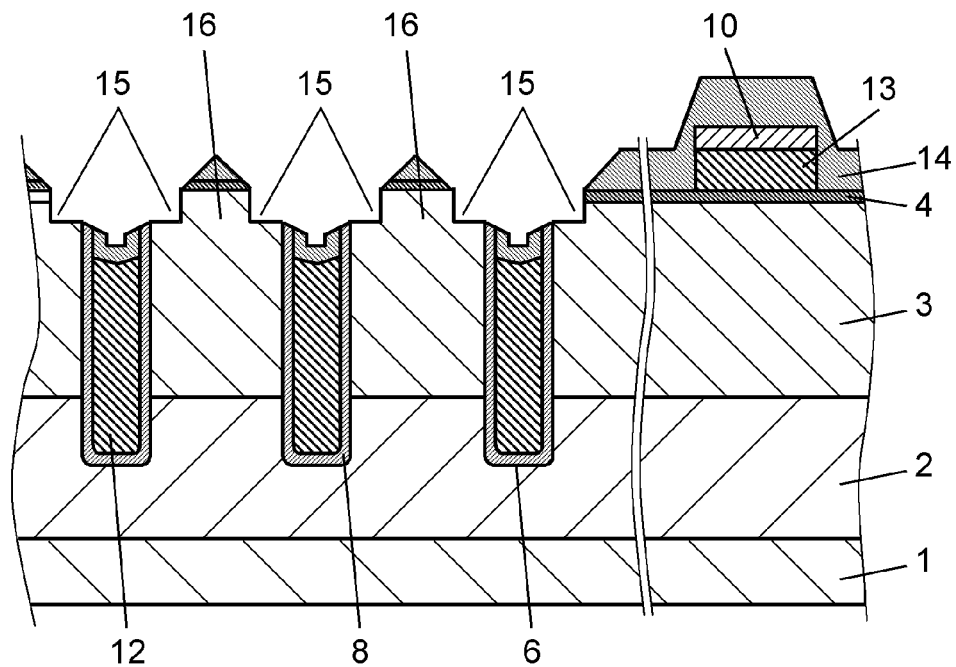
FIG. 56 is a cross-sectional view illustrating a modified example of a semiconductor device according to an exemplary embodiment of the present invention.
Figure 57:
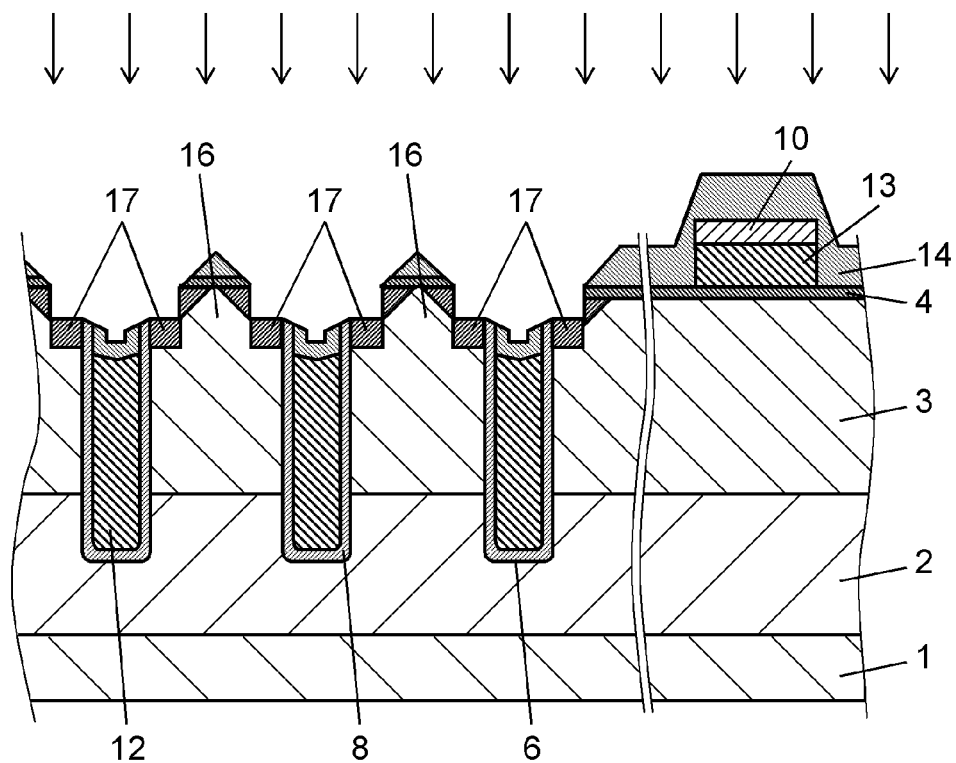
FIG. 57 is a cross-sectional view illustrating a modified example of a semiconductor device according to an exemplary embodiment of the present invention.
Figure 58:
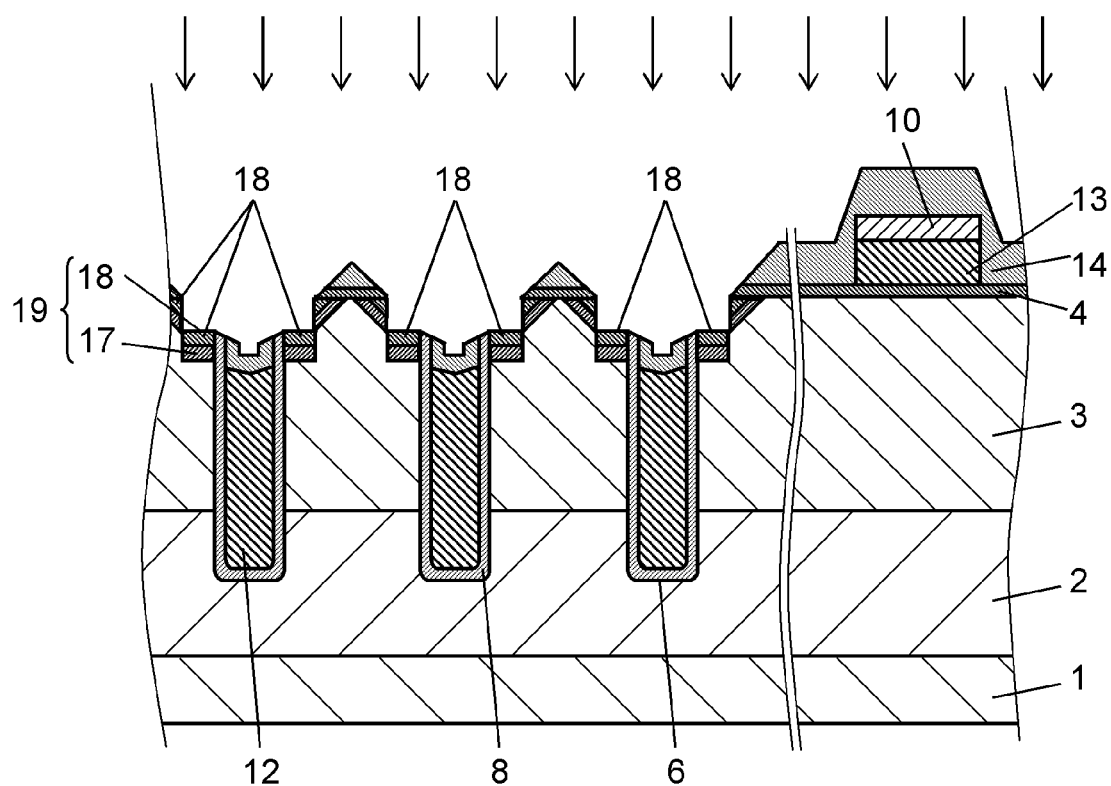
FIG. 58 is a cross-sectional view illustrating a modified example of a semiconductor device according to an exemplary embodiment of the present invention.

After conductive polysilicon film 9 with a thickness of 200 nm to 800 nm as a gate electrode material is deposited on the entire surface in FIG. 37, silicon oxide film 10 with a thickness of 50 nm to 200 nm is deposited thereon as shown in FIG. 51. Subsequently, as shown in FIG. 52, resist pattern 11 covering a polysilicon interconnection forming region of a gate drawing interconnection or the like is formed and silicon oxide film 10 is etched using resist pattern 11 as a mask. Polysilicon film 9 may be etched using patterned silicon oxide film 10 as a mask after removing the resist. Accordingly, as shown in FIG. 53, polysilicon film 9 on silicon oxide film 4 and trench 6 is removed to form gate electrode 12 in trench 6 and to form polysilicon interconnection 13 having silicon oxide film 10 formed thereon in the transistor non-forming region at the same time. Subsequently, as shown in FIG. 54, first insulating film 14 is formed on the substrate. First insulating film 14 fills the concave portion on gate electrode 12 and has a portion increasing in thickness with an increase in distance from the top of trench 6 on the substrate surface on both sides of trench 6. At this time, a thick stacked film including silicon oxide film 10 and first insulating film 14 is formed on polysilicon interconnection 13. Accordingly, as shown in FIGS. 57 and 58, when first source region 15 and second source region 16 are formed in the subsequent processes, N-type impurities are not introduced into polysilicon interconnection 13 even with an implantation acceleration voltage set to be higher. In other words, N-type impurities are introduced into polysilicon interconnection 13 shown in FIG. 50.

The above-mentioned exemplary embodiment does not limit the technical scope of the present invention and can be modified and applied in various forms without departing from the technical spirit of the present invention, in addition to the above-mentioned. For example, a polysilicon film is used as the material of gate electrode 12, but other conductive material such as amorphous silicon may be used. Similarly, the materials of silicon oxide film 4, cap insulating film 10, first insulating film 14, second insulating film 18, barrier metal film 22, and metal film 23 are not limited to the above-mentioned materials, but may be appropriately changed. The processes described in the above-mentioned exemplary embodiment can be replaced with known processes equivalent thereto, as long as the advantages of the present invention can be achieved.

The present invention describes a semiconductor device with vertical gate having vertical gate electrodes in which plural trenches 6 are arranged in parallel, but may be applied to semiconductor device with vertical gates having vertical gate electrodes in which trenches are arranged in a lattice shape in which the trenches cross each other and in a zigzag shape.

According to the present invention, it is possible to form a source region and a body contact region even for a small gate electrode gap. The present invention is useful as a semiconductor device with vertical gate and a method of manufacturing the semiconductor device with vertical gate.

What is claimed is:

1. A method of manufacturing a semiconductor device with vertical gate, comprising the steps of:
    (a) forming a drain region of a first conductivity type on a semiconductor substrate;
    (b) forming a first body region of a second conductivity type, which is opposite to the first conductivity type, on the drain region;
    (c) forming a trench and an adjacent trench adjacent to the trench, each penetrating the first body region and reaching the drain region;
    (d) forming a gate insulating film on a side wall of the trench;
    (e) forming a gate electrode in the trench so as to leave a concave portion on the top of the trench after the step of (d);
    (f) forming a first insulating film that is formed in the concave portion and on a portion between the trench and the adjacent trench, wherein a thickness of the first insulating film formed on the portion increases with an increase in distance from an end of the trench in the first body region to a substantially middle position between the trench and the adjacent trench after the step of (e); and
    (g) forming a first source region of the first conductivity type, which is disposed along the trench and which is adjacent to the trench, by introduction of impurities through the first insulating film after the step of (f).

2. The method of manufacturing a semiconductor device with vertical gate according to claim 1, wherein the step of (e) includes the steps of;
    forming a conductive polysilicon film;
    forming a cap insulating film on the conductive polysilicon film; and
    forming an interconnection and the gate electrode, which are formed of the conductive polysilicon film covered with the cap insulating film, by processing the cap insulating film and the conductive polysilicon film.

3. The method of manufacturing a semiconductor device with vertical gate according to claim 1, wherein the thickness-increasing portion of the first insulating film has a forward tapered shape with a slope which forms an angle of 30° to 60° with respect to the substrate surface.

4. The method of manufacturing a semiconductor device with vertical gate according to claim 1, wherein in the step of (f), the first insulating film is formed on the entire substrate surface and in the step of (g), the introduction of impurities for forming the first source region is carried out by ion implantation.

5. The method of manufacturing a semiconductor device with vertical gate according to claim 1, further comprising the steps of:
    (g1) exposing a surface of the substrate on both sides of the trench and a part of the side wall of the trench by etching back the first insulating film after the step of (g); and
    (g2) forming a second source region of the first conductivity type, which is disposed along the trench, on the top of the first source region by introduction of impurities through the etched-back first insulating film after the step of (g1).

6. The method of manufacturing a semiconductor device with vertical gate according to claim 5, wherein in the step of (g1), the etching-back of the first insulating film is carried out by dry etching or wet etching.

7. The method of manufacturing a semiconductor device with vertical gate according to claim 5, wherein in the step of (g2), the introduction of impurities for forming the second source region is carried out by ion implantation.

8. The method of manufacturing a semiconductor device with vertical gate according to claim 1, further comprising the steps of;
    (h) forming a second insulating film to cover the first insulating film after the step of (g);
    (i) forming an embedded insulating film, which is formed of a part of a stacked insulating film including the first insulating film and the second insulating film, in the trench on the gate electrode, and exposing a first portion of the first body region by etching the stacked insulating film;

(j) forming a second body region of the second conductivity type on the top of the first body region so as to be adjacent to the second source region by introducing impurities into the first portion of the first body region; and (k) forming a conductive film which electrically connects the second source region and the second body region.

9. The method of manufacturing a semiconductor device with vertical gate according to claim 8, further comprising a step of planarizing a surface of the stacked insulating film through a CMP between the step of (h) and the step of (i).

10. The method of manufacturing a semiconductor device with vertical gate according to claim 8, wherein in the step of (i), the etching is carried out under such conditions that an etching rate of the stacked insulating film formed in a prearranged region for the second body region is higher than the etching rate of the stacked insulating film formed on the gate electrode.

11. The method of manufacturing a semiconductor device with vertical gate according to claim 8, wherein in the step of (j), the introduction of impurities for forming the second body region is carried out by ion implantation.

12. The method of manufacturing a semiconductor device with vertical gate according to claim 8, further comprising a step of removing a part of the stacked insulating film remaining on the gate electrode through etching, and exposing the second source region from the side wall of the trench between the step of (j) and the step of (k).

13. The method of manufacturing a semiconductor device with vertical gate according to claim 12, wherein the etching in the step of exposing the second source region from the side wall of the trench is carried out under such conditions that the top end portion of the side wall of the trench in the second source region is processed in a curved shape.

14. The method of manufacturing a semiconductor device with vertical gate according to claim 1, further comprising the steps of:

(f1) exposing a second portion of the first body region on both sides of the trench by isotropically removing a part of the first insulating film and a part of the gate insulating film between the step of (f) and the step of (g); and (f2) forming a rectangular region on both sides of the top of the trench after the step of (f1) by removing the second portion of the first body region.

15. The method of manufacturing a semiconductor device with vertical gate according to claim 14, wherein the step of (g) is a step of forming the first source region on the bottom surface of the rectangular region in a self-alignment manner.

16. The method of manufacturing a semiconductor device with vertical gate according to claim 14, further comprising the steps of;

(h) forming a second insulating film to cover the first insulating film after the step of (g);

(i) forming an embedded insulating film, which is formed of a part of a stacked insulating film including the first insulating film and the second insulating film, in the trench on the gate electrode, and exposing a third portion of the first body region by etching the stacked insulating film;

(j) forming a second trench in the first body region by removing the third portion of the first body region.

17. The method of manufacturing a semiconductor device with vertical gate according to claim 16, wherein an upper surface of the second insulating film is located at a position lower than an upper surface of the third portion of the first body region after the step of (i).

18. The method of manufacturing a semiconductor device with vertical gate according to claim 16, wherein the step of (j) is a step of forming the second trench in a self-alignment manner using the second insulating film as a mask.

19. The method of manufacturing a semiconductor device with vertical gate according to claim 16, further comprising the steps of;

(k) forming a second body region of the second conductivity type on the bottom of the second trench by introducing impurities into the second trench; and (l) forming a conductive film which electrically connects the second source region and the second body region to each other.

20. The method of manufacturing a semiconductor device with vertical gate according to claim 19, wherein the step of (k) is a step of forming the second body region in a self-alignment manner using the second insulating film as a mask.

* * * * *